US008718986B2

(12) United States Patent
Suzuki

(10) Patent No.: US 8,718,986 B2
(45) Date of Patent: May 6, 2014

(54) ION IMPLANTATION DISTRIBUTION GENERATING METHOD AND SIMULATOR

(75) Inventor: Kunihiro Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 419 days.

(21) Appl. No.: 13/216,660

(22) Filed: Aug. 24, 2011

(65) Prior Publication Data

US 2011/0307229 A1   Dec. 15, 2011

Related U.S. Application Data

(63) Continuation of application No. PCT/JP2010/050449, filed on Jan. 8, 2010.

(30) Foreign Application Priority Data

Feb. 27, 2009   (JP) .................................. 2009-046914

(51) Int. Cl.
*G06F 17/50*   (2006.01)

(52) U.S. Cl.
USPC ................... 703/2; 703/14; 703/18; 716/136; 438/17

(58) Field of Classification Search
USPC ......................... 703/2, 4, 18; 438/17; 716/136
See application file for complete search history.

(56) References Cited

U.S. PATENT DOCUMENTS

| 6,377,141 | B1 * | 4/2002 | Hirabayashi | 333/204 |
|---|---|---|---|---|
| 6,747,316 | B2 * | 6/2004 | Matsuoka et al. | 257/344 |
| 7,149,667 | B2 | 12/2006 | Suzuki | |
| 7,635,602 | B2 * | 12/2009 | Suzuki | 438/17 |
| 8,575,652 | B2 * | 11/2013 | Kamata | 257/192 |
| 2002/0043689 | A1 * | 4/2002 | Matsuoka et al. | 257/368 |
| 2003/0236646 | A1 | 12/2003 | Suzuki | |
| 2005/0184255 | A1 | 8/2005 | Amakawa | |
| 2008/0109768 | A1 | 5/2008 | Suzuki | |
| 2008/0166824 | A1 * | 7/2008 | Suzuki | 438/17 |

FOREIGN PATENT DOCUMENTS

| JP | 5-152239 | 6/1993 |
|---|---|---|
| JP | 2003-163173 A | 6/2003 |
| JP | 2004-22965 A1 | 1/2004 |
| JP | 2005-217230 A1 | 8/2005 |
| JP | 2006-12945 A1 | 1/2006 |
| WO | WO 2007/004272 A1 | 1/2007 |

OTHER PUBLICATIONS

International Search Report for International Application No. PCT/JP2010/050449 dated Apr. 5, 2010.

(Continued)

*Primary Examiner* — Thai Phan
(74) *Attorney, Agent, or Firm* — Kratz, Quintos & Hanson, LLP

(57) ABSTRACT

A method of generating an ion implantation distribution by a computer is disclosed. The method includes calculating ion implantation distribution regions in a case of generating the ion implantation distribution with a large tilt angle and generating an analytical model of the ion implantation distribution in correspondence with each of the ion implantation distribution regions by using a Gauss distribution model, in which the ion implantation distribution regions have different influence on a channel region depending on a gate structure formed on the ion distribution regions.

20 Claims, 26 Drawing Sheets
(1 of 26 Drawing Sheet(s) Filed in Color)

(56) References Cited

OTHER PUBLICATIONS

J. C. Hu, A. Chatterjee, M. Mehrotra, J. Xu, W. -T. Shiau, and M. Rodder, "Sub-0.1 mm CMOS with source/drain extension spacer formed using nitrogen implantation prior to thick gate re-oxidation," Symposium on VLSI Tech., pp. 188-189, 2000.
Y. Momiyama, K. Okabe, H. Nakao, M. Kojima, M. Kase, and T. Sugii, "Extension engineering using carbon co-implantation technology for low power CMOS design with phosphorus- and Boron-extension," Ext. abs. The 7th International Workshop on Junction Technology, pp. 63-64, 2007.
P.A. Stolk, D. J. Eaglesham, H. -J. Gossmann, and J. M. Poate, "Carbon incorporation in silicon for suppressing interstitial-enhanced boron diffusion," Appln. Phys. Lett., vol. 66, pp. 1370-1372, 1995.
E. Napolitani, A. Coati, D. De Salvador, and A. Camera, "Complete suppression of the transient enhanced diffusion of B implanted in preamorphized Si by interstitial trapping in a spatially separated C-rich layer," Appln. Phys. Lett., vol. 79, pp. 4145-4147, 2001.
G. Impellizzeri, J. H. R dos Santos, S. Mirabella, and F. Priolo, "Role of fluorine in suppressing boron transient enhanced diffusion in preamorphized Si," Appl. Phys. Lett., vol. 84, pp. 1862-1864, 2004.
Giorgia M. Lopez and Vincenzo Fiorentini, Giuliana Impellizzeri and Salvatore Mirabella "Fluorine in Si: Native-defect complexes and the suppression of impurity diffusion," Physical Review B, vol. 72, 045219, 2005.
X. D. Pi, C. P. Burrows, and P. G. Coleman, "Fluorine in silicon: diffusion, trapping, and precipitation," Physical Review Letters, vol. 90, 155901-1, 2003.
S. H. Jain, P. B. Griffin, J. D. Plummer, S. McCoy, J. Gelpsey, T. Selinger, and D.F. Downery, "Low resistance, low-leakage ultrashallow p+-junction formation using milisecond flash anneals," IEEE Trans. Electron Devices, ED-52, No. 7, pp. 1610-1615, 2005.
J. Gelpsey, S. McCoy, D. Camm, W. Lerch, S. Paul, P. Pichler, J.O. Borland, P. Timans, "Flash annealing technology for USJ: Modeling and metrology," 14th RTP, pp. 103-110, 2006.
W. Lerch, S. Paul. J. Nisess, J. Chan, S. McCoy, J. Gelpsey, F. Cristiano, F. Severac, P. F. Fazzini, D. Bolze, P. Pichler, A. Martinez, A. Mineji, and S. Shishiguchi, "Experimental and theoretical results of dopant activation by a combination of spike and flash annealing," 7th International Workshop on Junction.
K. T. Nishinohara, T. Ito, and K. Suguro, "Improvement of performance deviation and productivity of MOSFETs with gate length below 30 nm by flash lamp annealing," IEEE Transactions on Semiconductor Manufacturing, vol. 17, No. 3, pp. 286-291, 2004.
F. Ootsuka, A. Katakami, K. Shirai, T. Watanabe, H. Nakata, Y. Ohji, and M. Tanjyo, "Ultralow-thermal-budget CMOS process using flash-lamp annealing for 45 nm Metal/high-k FETs," IEEE Transactions on Electron Devices, ED-55, No. 4, pp. 1042-1049, 2008.
H. Ahn, and M. A. El. Nokali, Inverse modeling and its application in the design of high electron mobility transistors, IEEE Transactions on Electron Devices, ED-42, No. 4, pp. 598-604, 1995.
Z. K. Lee, M.B. McIlrash, and D. A. Antoniadis, "Two-dimensional doping profile characterization of MOSFET's by inverse modeling using I-V characteristics in the subthreshold region," IEEE Transactions on Electron Devices, ED-46, No. 8, pp. 1640-1649, 1999.
C. Y. T. Chiang, Y. T. Yeow, and R. Ghodsi, "Inverse modeling of two-dimensional MOSFET dopant profile via capacitance of the source/dran gated diode," IEEE Transactions on Electron Devices, ED-47, No. 7, pp. 1385-1392, 2000.
I. J. Djomehri and D. A. Antoniadis, "Inverse modeling of sub-100 nm MOSFETs using I-V and C-V," IEEE Transactions on Electron Devices, ED-49, No. 4, pp. 568-575, 2002.
G. Curatola, G. Doornbos, J. Loo, Y. V. Ponomarev, and G. I. Iannaccone, "Detailed modeling of sub-100-nm MOSFETs based on Schrodinger DD per subband and experiments and evaluation of the performance gap to ballistic transport," IEEE Transactions on Electron Devices, ED-52, No. 8, pp. 1851-1858.
H. Hayashi, H. Matsuhashi, K. Fukuda, and K. Nishi, "Inverse modeling and its application to MOSFET channel profile extraction,": IEICE. Trans. Electron., vol. E82-C, No. 6, pp. 862-869, 1999.
S. Furukawa, H. Matsumura, and H. Ishiwara, "Theoretical Considerations on Lateral Spread of Implanted Ions", Jpn J. Appl.Phys., vol. 11, pp. 134-142, 1972.
H. G. Lee and R. W. Dutton, "Two-dimensional low concentration boron profiles; modeling and measurement", IEEE Trans. Eelctron Devices, ED-28. pp. 1136-1147, 1981.
H. Ryssel, J. Lorentz, and W. Kruger, "Ion implantation into nonplanar targets; Monto Carlo simulations and analytical models", Nuclear Instruments and Methods in Physics Research, vol. B19-20, pp. 45-49, 1987.
Kunihiro Suzuki, Ritsuo Sudo and Thomas Feudel, "Simple analytical expression for dose depending ion-implanted Sb profiles using a joined half Gaussian Function and one with exponential tail", Solid-state Electronics, vol. 42. pp. 463-465, 1998.
Kunihiro Suzuki, Ritsuo Sudo, Yoko Tada, Miki Tomotani, Thomas Feudel, and W. Fichtner "Comprehensive analytical expression for does dependent ion-implanted impurity concentration profiles". Solid-state Electronics, vol. 42, pp. 1671-1678, 1998.
Toshihiko Miyashita and Kunihiro Suzuki, "Experimental evaluation of depth-dependent lateral standard deviation for various ions in a-Si from one-dimentional tilted implantation profiles", IEEE Trans. Electron Devices, ED-46, pp. 1824-1828, 1999.
Kunihiro Suzuki, Ritsuo Sudo, Thomas Feudel and Wolfgang Fichtner, "Compact and comprehensive database for ion-implanted As profile", IEEE Trans. Electron Devices, ED-47, pp. 44-49, 2000.
Kunihiro Suzuki and Ritsuo Sudo, "Analytical expression for ion-implanted impurity concentration profiles", Solid-State Electronics, vol. 44, pp. 2253-2257, 2000.
Kunihiro Suzuki, Ritsuo Sudo and Masanori Nagase, "Estimating lateral straggling of impurity profiles of ions implanted into crystalline silicon", IEEE Trans. Electron Devices, 2000 IEEE Trans. Electron Devices, ED-48, pp. 2803-2807, 2001.
T. Wada, N. Kotani, "Design and development of 3-dimensional process simulator, " IEICE. Trans. Electron., vol. E82-C, No. 6, pp. 839-847, 1999.
http://www.selete.co.jp/?lang=EN&act=Research&sel_no=103: Semiconductor Leading Edge Technology.
W. K. Hofker, "Implantation of boron in silicon," Philips Res. Rep. Suppl., vol. 8, pp. 1-121, 1975.
D. G. Ashworth, R. Oven, and B. Mundin, "Representation of ion implantation profiles by Pearson frequency distribution curves," Appl. Phys. D., vol. 23, pp. 870-876, 1990.
A. F. Tasch H. Shin, C. Park, J. Alvis, and S. Novak, "An improved approach to accurately model shallow B and BF2 implants in silicon," J. Electrochem. Soc., vol. 136, pp. 810-814, 1989.
C. Park, K. M. Klein, and A. L. Tasch, "Efficient modeling parameter extraction for dual Pearson approach to simulation of implanted impurity profiles in silicon," Solid-State Electronic, vol. 33, pp. 645-650, 1990.
J. F. Gibbons, S. Mylroie, "Estimation of impurity profiles in ion-implanted amorphous targets using joined half-Gaussian distributions," Appln. Phys. Let., vol. 22, p. 568-569, 1973.
Y. Taur, C. H. Wann, and D. J. Frank, "25 nm CMOS design considerations," IEDM Tech. Dig., pp. 789-792, 1998.
Y. Momiyama, K. Okabe, M. Kase, M. Kojima, and T. Sugii, "Laterla extension engineering using nitrogen implantation (N-tub) for high-performance 40-nm-pMOSFETs," IEDM Tech. Dig., pp. 647-650, 2002.

\* cited by examiner

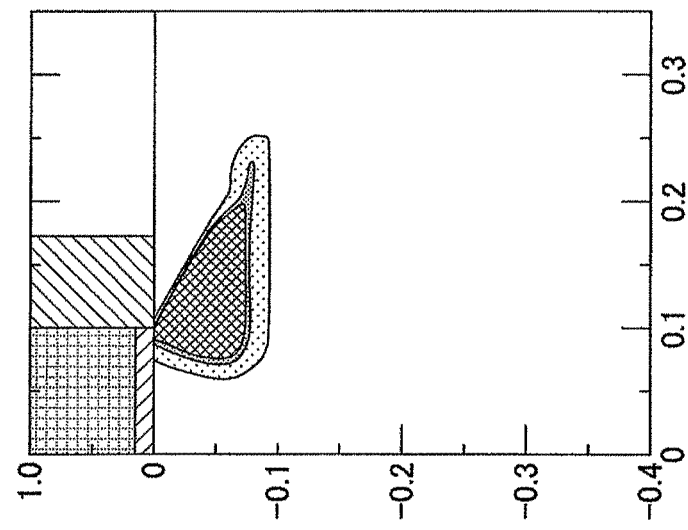
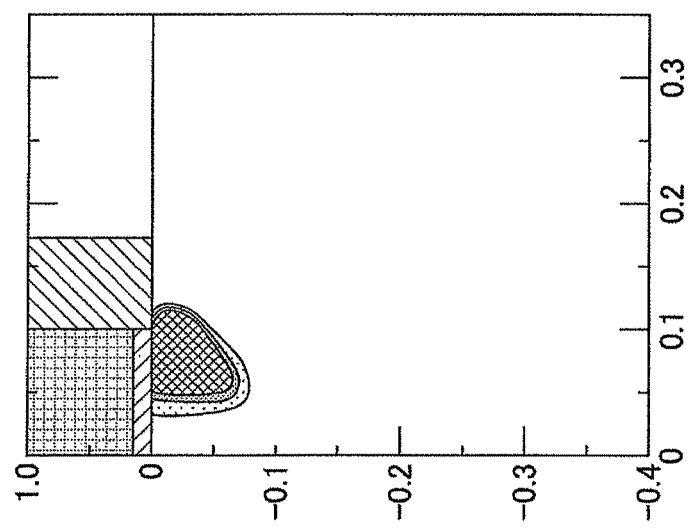
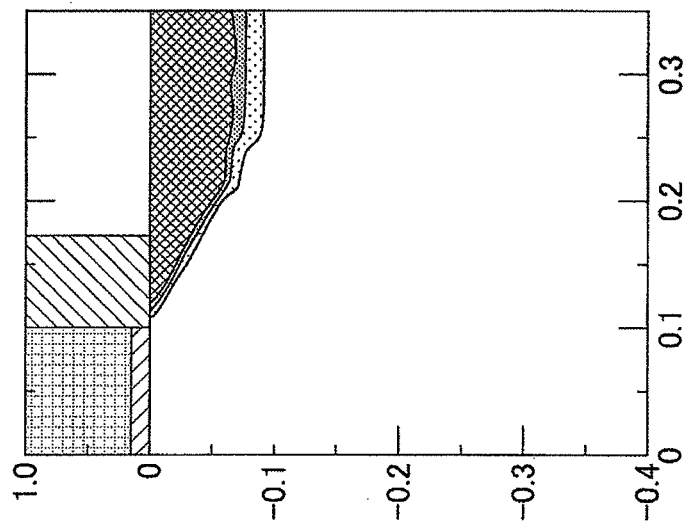

B (Tail function)

| Energy (keV) | $R_p$ (nm) | $\Delta R_p$ (nm) | $\gamma$ | $\beta$ | L (nm) | $\alpha$ | $\Phi_{chan}$ (cm$^{-2}$) |
|---|---|---|---|---|---|---|---|
| 20 | 73.4 | 41.1 | −0.7 | 5.5 | 252.4 | 2.60 | $1.9 \times 10^{14}$ |
| 40 | 136.8 | 56.4 | −0.7 | 5.5 | 333.8 | 2.75 | $1.0 \times 10^{14}$ |
| 80 | 253.3 | 77.1 | −0.7 | 5.5 | 421.2 | 3.00 | $8.0 \times 10^{13}$ |

B (Tail Pearson)

| Energy (keV) | $R_{p2}$ (nm) | $\Delta R_{p2}$ (nm) | $\gamma_2$ | $\beta_2$ |
|---|---|---|---|---|
| 20 | 91.9 | 56.4 | 0.28 | 4.0 |
| 40 | 162.0 | 76.7 | 0.24 | 4.0 |
| 80 | 285.5 | 102.0 | 0.15 | 3.9 |

As (Tail function)

| Energy (keV) | $R_p$ (nm) | $\Delta R_p$ (nm) | $\gamma$ | $\beta$ | L (nm) | $\alpha$ | $\Phi_{chan}$ (cm$^{-2}$) |
|---|---|---|---|---|---|---|---|
| 20 | 19.4 | 8.9 | 0.5 | 3.5 | 156.8 | 0.95 | $2.2 \times 10^{13}$ |
| 40 | 32.5 | 13.5 | 0.5 | 3.5 | 274.4 | 0.95 | $1.6 \times 10^{13}$ |
| 80 | 59.5 | 23.3 | 0.5 | 3.5 | 487.0 | 0.95 | $1.5 \times 10^{13}$ |

As (Tail Pearson)

| Energy (keV) | $R_{P2}$ (nm) | $\Delta R_{p2}$ (nm) | $\gamma_2$ | $\beta_2$ |
|---|---|---|---|---|
| 20 | 25.6 | 18.9 | 2.56 | 13.8 |
| 40 | 44.6 | 33.2 | 2.64 | 14.0 |
| 80 | 81.7 | 59.1 | 2.65 | 14.0 |

ION IMPLANTATION DISTRIBUTION GENERATING METHOD AND SIMULATOR

CROSS-REFERENCE TO RELATED APPLICATIONS

This application is a U.S. continuation application filed under 35 USC 111(a) claiming benefit under 35 USC 120 and 365(c) of PCT application JP 2010/050449, filed on Jan. 8, 2010, which claims priority to Application ser. NO. 2009-046914, filed in Japan on Feb. 27, 2009. The foregoing applications are hereby incorporated herein by reference.

FIELD

The embodiment discussed herein is related to an ion implantation distribution generating method and a simulator.

BACKGROUND

In silicon integrated circuit devices, to introduce impurities into a silicon substrate, ion implantation is generally performed. In process construction of such silicon integrated circuit devices, to obtain necessary device structure, it is necessary to determine ion implantation conditions. To that end, simulation is generally performed to determine the ion implantation conditions.

In a cutting-edge MOSFET (Metal-Oxide-Semiconductor Field-Effect Transistor), research is being conducted to activate while maintaining the ion implantation distribution using the co implantation technique or Flash lamp anneal technique. Namely, the trend is that complicated diffusion phenomena will no longer have to be considered. Until recently, a diffusion distribution far shifted from the ion implantation distribution has been a main factor to determine the device characteristics. However, when such diffusion can be ignored, it becomes more and more important to precisely predict (estimate) two-dimensional ion implantation distribution.

On the other hand, inverse modeling is also used which predicts an impurity distribution reproducing obtained electrical characteristics separately from process conditions (i.e., without the process conditions). In the inverse modeling, though it has little relationship with the process conditions, it becomes possible to obtain knowledge of impurity distribution separately from an unestablished process model. In this case, the Gauss distribution or the complementary error function distribution is used. By optimizing the parameter of the function, the electric characteristics are reproduced. After that, it becomes possible to predict how to change the distribution to realize the improvement of the device characteristics.

When the tilt angle is small, a general model using such a Gauss distribution is expressed in the following formulas (1) to (4) while assuming that the incidence is normal and that the coordinates (x,y) of the ion implantation system are the same as the coordinates (t,s) of an actual device.

(i) Substrate

In a substrate, it is assumed that the concentration is constant as described in the following formula (1).

$$N_1(x,y) = N_{sub}, N_0(x,y) = N_{sub} \tag{1}$$

(ii) Channel Ion Implantation Distribution

Since ions are ejected to the front face while no gate electrode is formed, the distribution is expressed in the following formula (2).

$$N_1(x,y) = \frac{\Phi}{\sqrt{2\pi}\,\Delta R_p}\exp\left[-\frac{(y-R_p)^2}{2\Delta R_p^2}\right] \tag{2}$$

(iii) Extension Region Ion Implantation Distribution

Assuming that the gate electrode having the length of $L_G$ is formed, the distribution is expressed in the following formula (3).

$$N_2(x,y) = \left[1 - \frac{\mathrm{erf}\left(\frac{\frac{L_G}{2}-x}{\sqrt{2}\,\Delta R_{pt}}\right) + \mathrm{erf}\left(\frac{\frac{L_G}{2}+x}{\sqrt{2}\,\Delta R_{pt}}\right)}{2}\right] \frac{\Phi}{\sqrt{2\pi}\,\Delta R_p}\exp\left[-\frac{(y-R_p)^2}{2\Delta R_p^2}\right] \tag{3}$$

(iv) Source/Drain Region Ion Implantation Distribution

Assuming that side walls having the thickness of $L_{side}$ are formed on both sides of the gate electrode, the distribution is expressed in the following formula (4).

$$N_3(x,y) = \left[1 - \frac{\mathrm{erf}\left(\frac{\frac{L_G+2L_{side}}{2}-x}{\sqrt{2}\,\Delta R_{pt}}\right) + \mathrm{erf}\left(\frac{\frac{L_G+2L_{side}}{2}+x}{\sqrt{2}\,\Delta R_{pt}}\right)}{2}\right] \frac{\Phi}{\sqrt{2\pi}\,\Delta R_p}\exp\left[-\frac{(y-R_p)^2}{2\Delta R_p^2}\right] \tag{4}$$

In formulas, the symbols "$\delta$", "$R_p$", "$\Delta R_p$", and "$\Delta R_{pt}$" denote a dose amount, projection of a range, straggling of the projection of the range, and straggling of the projection of the range in lateral direction, respectively.

Then, signs are added depending on the types of the distributions and the summing operation is performed. Depending on the processes, there may be a case where the order of ion implantations changes and the timing of forming the side wall also changes. However, by appropriately changing the parameters in the formulas, it may be possible to correspond to those changes. By considering the types of the distributions and performing the summing operation, the impurity concentration distribution $N_{net}$ may be obtained as given in the following formula (5) as the final distribution.

$$N_{net} = \sum_i sgn_i N_i \tag{5}$$

Where, the symbol "$sgn_i$" denotes a function expressing the type and is given as in the following formula (6).

$$sgn_i = \begin{cases} 1 & N_i: \text{donor} \\ -1 & N_i: \text{acceptor} \end{cases} \tag{6}$$

When it becomes possible to analytically express the entire ion implantation distribution for the MOS structure like a Gauss distribution, it may become possible to easily perform the device simulation. Further, such a distribution may also be applied to the inverse modeling. To that end, it is preferable to simply and analytically express the channel ion implantation distribution, the extension region ion implantation distribution, the source/drain region ion implantation distribution, and a pocket ion implantation distribution. Especially, it may be important to associate the pocket ion implantation distribution with the actual process. This is because the pocket ion implantation distribution may directly influence the short-channel resistance, the on-state current, and the off-sate current of the device and a main part of the device characteristics.

As described above, when a tilt angle is small, the two-dimensional ion implantation distribution may be expressed by using a simple analytical model when the range projection straggling in lateral direction ($\Delta R_{pt}$) is obtained (see, for example, Patent Document 1, Non-Patent Documents 1 to 3).

Patent Document 1: Japanese Laid-open Patent Publication No. 2003-163173

Non-Patent Document 1: J. C. Hu, A. Chaterjee, M. Mehrotra, J. Xu, W.-T. Shiau, and M. Rodder, "Sub-0.1 mm CMOS source/drain extension spacer formed using nitrogen implantation prior to thick gate re-oxidation," Sysmposium on VLSI Tech., pp. 488-189, 2000.

Non-Patent Document 2: Y. Momiyama, K. Okabe, H. Nakao, M. Kojima, M. Kase, and T. Sugii, "Extension engineering using carbon co-implantation technology for low power CMOS design with phousphorus- and Boron-extension," Ext. abs. The 7th International Workshop on Junction Technology, pp. 63-64, 2007.

Non-Patent Document 3: P. A. Stolk, D. J. Eaglesham, H.-J. Gossmann, and J. M. Poate, "Carbon incorporation in silicon for suppressing interstitial-enhanced boron diffusion," Appl. Phys. Lett., vol. 66, pp. 1370-1372, 1995.

Non-Patent Document 4: E. Napolitani, A. Coati, D. De Salvador, and A. Carnera, "Complete suppression of the transient enhanced diffusion of B implanted in preamorphized Si by interstitial trapping in a spatially separated C-rich layer," Appl. Phys. Lett., vol. 79, pp. 4145-4147, 2001.

Non-Patent Document 5: G. Impellizzeri, J. H. R dos Santos, S. Mirabella, and F. Priolo, "Role of fluorine in suppressing boron transient enhanced diffusion," Appl. Phys. Lett., vol. 84, pp. 1862-1864, 2004.

Non-Patent Document 6: Giorgia M. Lopez and Vincenzo Fiorentini, Giuliana Impellizzeri and Salvatore Mirabella "Fluorine in Si: Native-defect complexes and the suppression of impurity diffusion," Physical Review B, vol. 72, 045219, 2005.

Non-Patent Document 7: X. D. Pi, C. P. Burrows, and P. G. Coleman, "Fluorin in silicon: diffusion, trapping, and precipitation," Physical Review Letters, vol. 90, 155901-1, 2003.

Non-Patent Document 8: S. H. Jain, P. B. Griffin, J. D. Plummer, S. McCoy, J. Gelpey, T. Selinger, and D. F. Downery, "Low resistance, low-leakage ultrashallow p+-junction formation using millisecond flash anneals," IEEE Trans. Electron Devices, ED-52, No. 7, pp. 1610-1615, 2005.

Non-Patent Document 9: J. Gelepey, S. McCoy, D. D. Camm, W. Lerch, S. Paul, P. Pichler, J. O. Borland, P. Timans, "Flash annealing technology for USJ: Modeling and metrology," 14th RTP, pp. 103-110, 2006.

Non-Patent Document 10: W. Lerch, S. Paul. J. Nisess, J. Chan, S. McCoy, J. Gelpey, F. Cristiano, F. Severac, P. F. Fazzini, D. Boltze, P. Pichler, A. Martinez, A. Mineji, and S. Shishiguchi, "Experimental and theoretical results of dopant activation by a combination of spike and flash annealing," 7th International Workshop on Junction technology, pp. 129-134, 2007.

Non-Patent Document 11: K. T. Nishinohara, T. Ito, and K. Suguro, "Improvement of performance deviation and productivity of MOSFETs with gate length below 30 nm by flash lamp annealing," IEEE Transactions on Semiconductor Manufacturing, vol. 17, No. 3, pp. 286-291, 2004.

Non-Patent Document 12: F. Ootsuka, A. Katakami, K. Shirai, T. Watanabe, H. Nakata, Y. Ohji, and M. Tanjyo, "Ultaralow-thermal-budget CMOS process using flash-lamp annealing for 45 nm Metal/high-k FETs," IEEE Transactions on Electron Devices, ED-55, No. 4, pp. 1042-1049, 2008.

Non-Patent Document 13: H. Ahn, and M. A. E. Nokali, "Inverse modeling and its application in the design of high electron mobility transistors," IEEE Transactions on Electron Devices, ED-42, No. 4, pp. 598-604, 1995.

Non-Patent Document 14: Z. K. Lee, M. B. McIlrash, and D. A. Antoniadis, "Two-dimensional doping profile characterization of MOSFETs by inverse modeling using I-V characteristics in the subthreshold region," IEEE Transactions on Electron Devices, ED-46, No. 8, pp. 1640-1649, 1999.

Non-Patent Document 15: C. Y. T. Chiang, Y. T. Yeow, and G. Ghodsi, "Inverse modeling of two-dimensional MOSFET dopant profile via capacitance of the source/drain gated diode," IEEE Transactions on Electron Devices, ED-47, No. 7, pp. 1385-1392, 2000.

Non-Patent Document 16: I. J. Djomehri and D. A. Antoniadis, "Inverse modeling of sub-100 nm MOSFETs using I-V and C-V," IEEE Transactions on Electron Devices, ED-49, No. 4, pp. 568-575, 2002.

Non-Patent Document 17: G. Curatora, G. Doornbos, J. Loo, Y. V. Ponomarev, and G. I. Iannaccone, "Detailed modeling of sub-100-nm MOSFETs based on Schrogdinger DD per subband and experiments and evaluation of the performance gap to ballistic transport," IEEE Transactions on Electron Devices, ED-52, No. 8, pp. 1851-1858, 2005.

Non-Patent Document 18: H. Hayashi, M. Matsuhashi, K. Fukuda, and K. Nishi, "Inverse modeling and its application to MOSFET channel profile extraction," IEICE. Trans. Electron., vol. E82-C, No. 6, pp. 862-869, 1999.

Non-Patent Document 19: S. Furukawa, H. Matsumura, and H. Ishihara, "Theoretical Considerations on Lateral Spread of Implanted Ions", Jpn J. Appl. Phys., Vol. 11, pp. 134-142, 1972

Non-Patent Document 20: H. G. Lee and R. W. Dutton, "Two-dimensional low concentration borron profiles; modeling and measurement", IEEE Trans. Electron Devices, ED-28, pp. 1136-1147, 1981

Non-Patent Document 21: H. Ryssel, J. Lorentz, and W. Kruger, "Ion implantation into non-planar targets; Monte Carlo simulations and analytical models", Nuclear Instruments and Methods in Physics Research, vol. B19-20, pp. 45-49, 1987

Non-Patent Document 22: Kunihiro Suzuki, Ritsuo Sudo and Thomas Feudel, "Simple analytical expression for dose dependent ion-implanted Sb profiles using a jointed half Gauss and one with exponential tail", Solid-state Electronics, vol. 42, pp. 463-465, 1998

Non-Patent Document 23: Kunihiro Suzuki, Ritsuo Sudo, Yoko Toda, Miki Tomotani, Thomas Feudel, and W. Fichtner "Comprehensive analytical expression for dose dependent ion-implanted impurity concentration profiles", Solid-state Electronics, vol. 42, pp. 1671-16784, 1998

Non-Patent Document 24: Toshihiko Miyashita and Kunihiro Suzuki, "Experimental evaluation of depth-dependent lateral standard deviation for various ions in a-Si from one-dimensional tilted implantation profiles", IEEE Trans. Electron Devices, ED-46, pp. 1824-1828, 1999

Non-Patent Document 25: Kunihiro Suzuki, Ritsuo Sudo, Thomas Feudel and Wolfgung Fichtner, "Compact and comprehensive database for ion-implanted As profiles", IEEE Trans. Electron Devices, ED-47, pp. 44-49, 2000

Non-Patent Document 26: Kunihiro Suzuki and Ritsuo Sudo, "Analytical expression for ion-implanted impurity concentration profiles", Solid-State Electronics, vol. 44, pp. 2253-2257, 2000

Non-Patent Document 27: Kunihiro Suzuki, Ritsuo Sudo and Masonori Nagase, "Estimating lateral straggling of impurity profiles of ions implanted into crystalline silicon", IEEE Trans. Electron Devices, 2000 IEEE Trans. Electron Devices, ED-48, pp. 2803-2807, 2001

Non-Patent Document 28: T. Wada, N. Kotani, "Design and development of 3-dimensional process simulator," IEICE. Trans. Electron., vol. E82-C, No. 6, pp. 839-847, 1999.

Non-Patent Document 29: http://www.selete.co.jp/?lang=EN&act=Research&sel_no=103: Semiconductor Leading Edge Technology Non-Patent Document 30: W. K. Hofker, "Implantation of boron in silicon," Philips Res. Rep. Suppl., vol. 8, pp. 1-121, 1975.

Non-Patent Document 31: D. G. Ashworth, R. Oven, and B. Mundin, "Representation of ion implantation profiles by Pearson frequency distribution curves," Appl. Phys. D., vol. 23, pp. 870-876, 1990.

Non-Patent Document 32: A. F. Tasch, H. Shin, C. Park, J. Alvis, and S. Novak, "An improved approach to accurately model shallow B and BF2 implants in silicon," J. Electrochem. Soc., vol. 136, pp. 810-814, 1989.

Non-Patent Document 33: C. Park, K. M. Klein, and A. L. Tasch, "Efficient modeling parameter extraction for dual Pearson approach to simulation of implanted impurity profiles in silicon," Solid-State Electronic, vol. 33, pp. 645-650, 1990.

Non-Patent Document 34: J. F. Gibbons, S. Mylroie, "Estimation of impurity profiles in ion-implanted amorphous targets using joined half-Gauss distributions," Appl. Phys. Let., vol. 22, p. 568-569, 1973.

Non-Patent Document 35: Y. Taur, C. H. Wann, and D. J. Frank, "25 nm CMOS design consideration," IEDM Tech. Dig., pp. 789-792, 1998.

Non-Patent Document 36: Y. Momiyama, K. Okabe, M. Kase, M. Kojima, and T. Sugii, "Lateral extension engineering using nitrogen implantation (N-tub) for high-performance 40-nm-pMOSFETs," IEDM Tech. Dig., pp. 647-650, 2002.

However, until recently, the actual two-dimensional ion implantation distribution has been evaluated only numerical-analytically by using a two-dimensional process simulator. Because of this feature, there may be a problem that, when the tilt angle is large, the ion implantation distribution in the MOS structure is not analytically evaluated. Further, the actual distribution is different from the Gauss distribution employed in the inverse modeling. Because of this feature, even when qualitative guidelines are given, it may be difficult to directly associate the actual distribution with the actual process conditions. Especially, there is no appropriate analytical model for the pocket ion implantation distribution in which ions are implanted at a large tilt angle. Accordingly, it may be difficult to get feedback from the distribution used in the inverse modeling to the actual process conditions.

Further, when assuming that the distribution along the axis of ion implantation is the Gauss distribution, the analytical model as described above may be obtained. However, such an analytical model may not be obtained when the distribution is the Pearson distribution generally used or the tail functions proposed by the inventor of the present invention (see, for example, Non-Patent Document 4).

Because of this feature, there may be problems such that strong expertise is needed to use the process simulator or the device simulator and that a vast amount of time is necessary for the simulations.

However, for developers involved in various devices and processes, sophisticated functions may not be needed, and there is a demand for providing a simulator as a tool providing for developer's experiences and intuitive settings. The simulator in this case is needed to be easily operated and provide fast operations. Further, the functions used in the simulator are required to be accurately operated even when the numbers of the functions are limited.

SUMMARY

According to an aspect of the present invention, there is provided a method for generating an ion implantation distribution by a computer. The method includes calculating ion implantation distribution regions in a case of generating the ion implantation distribution with a large tilt angle and generating an analytical model of the ion implantation distribution in correspondence with each of the ion implantation distribution regions by using a Gauss distribution model, in which the ion implantation distribution regions have different influence on a channel region depending on a gate structure formed on the ion distribution regions.

The object and advantages of the invention will be realized and attained by means of the elements and combinations particularly pointed out in the claim It is to be understood that both the foregoing general description and the following detailed description are exemplary and explanatory and are not restrictive of the invention as claimed.

BRIEF DESCRIPTION OF DRAWINGS

The patent or application file contains at least one drawing executed in color. Copies of this patent or patent application publication with color drawings will be provided by the U.S. Patent and Trademark Office upon request and payment of the necessary fee.

FIGS. 22A through 22C illustrate example ion implantation distributions in the pocket ion implantation;

FIG. 23 illustrates an example input screen of analytical model DAS of the example 1;

FIGS. 24A and 22B are graphs illustrating an example comparison in a tilt angle dependency of the ion implantation distribution between the analytical model and the numerical calculation;

FIG. 27 is tables illustrating a comparison between parameters of the tail function and parameters of tail Pearson distribution.

DESCRIPTION OF EMBODIMENT

Figure 1:
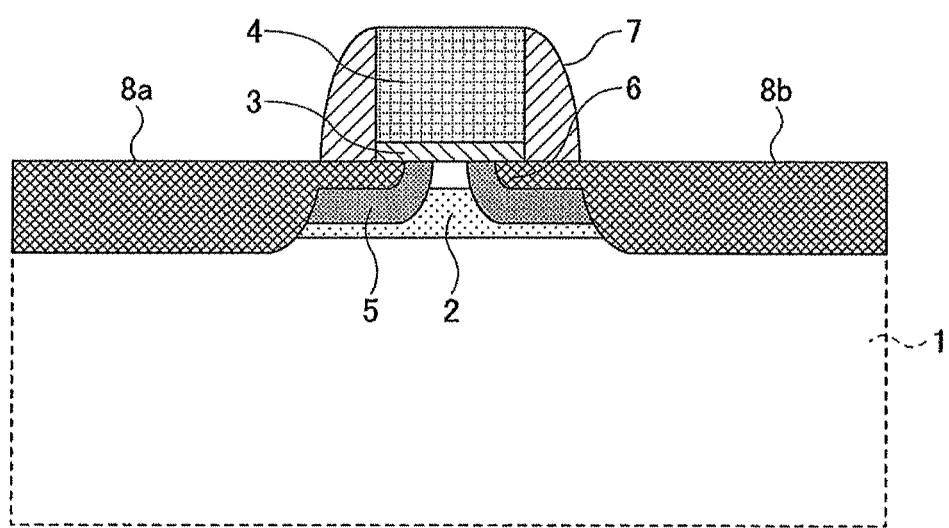
FIG. 1 illustrates an example impurity concentration distribution formed by steps of ion implantation including pocket ion implantation into a MOSFET.

Herein, an embodiment of the present invention is described with reference to FIGS. 1 to 7. First, a pocket ion implantation is described. FIG. 1 illustrates a case where an example impurity concentration distribution is formed by steps of ion implantation including pocket ion implantation into a MOSFET (Metal Oxide Semiconductor Field Effect Transistor). In FIG. 1, first, a channel ion implantation is performed on a substrate 1 to form a channel doping region (channel region) 2. Then, a gate structure including a gate insulating film 3 and a gate electrode 4 is formed. Then, an ion implantation with a large tilt angle is performed to form a pocket region 5. Next, an extension region 6 and side wall 7 are formed. Then, a source region 8a and a drain region 8b are formed.

Figure 2A:
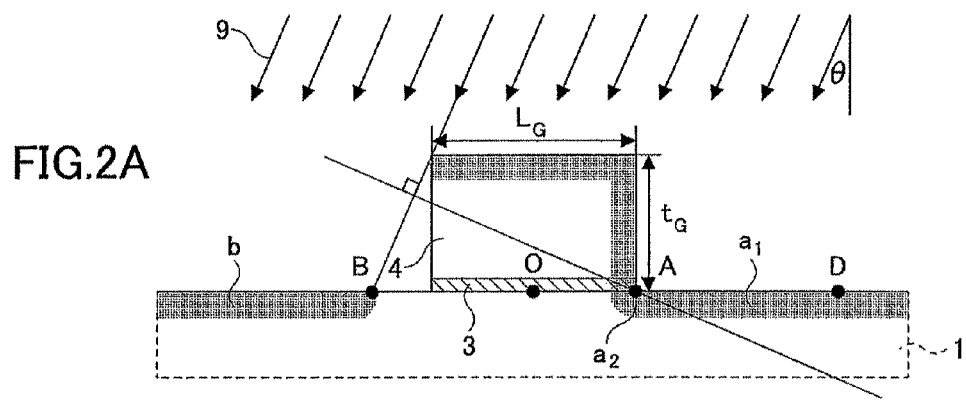
FIGS. 2A through 2C illustrate example steps of the pocket ion implantation.
Figure 2B:
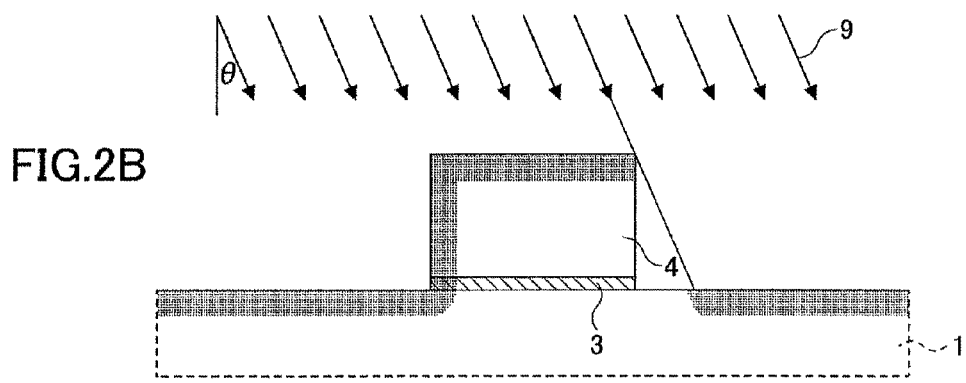
Figure 2C:
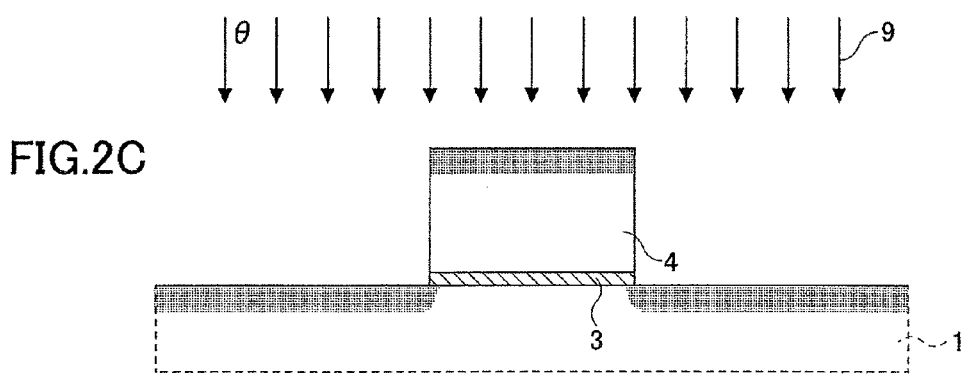

FIGS. 2A to 2C illustrate steps of the pocket ion implantation. To maintain symmetry, the pocket ion implantation is generally performed from four directions as illustrated in FIGS. 2A to 2C. Namely, as illustrated in FIG. 2A, in the first ion implantation, ions are ejected from the right-hand side of the gate electrode 4 with the tilt angle of θ. On the right-hand side of the gate electrode 4, ions are implanted into the side wall of the gate electrode 4 and the substrate 1. In this case, analysis is separately performed on regions $a_1$ and $a_2$. In the region $a_1$, the concentration is determined regardless of the existence of the gate electrode 4. On the other hand, in the region $a_2$, the concentration is influenced by the gate electrode 4. On the left-hand side of the gate electrode 4, there are an area where no ions are implanted because ions are blocked by the gate electrode 4 and an area b where ions are implanted (hereinafter the area b may be simplified as an area b shadowed (shadowing) by the gate electrode 4 or shadowing area b). Strictly, some ions may pass through the top part of the gate electrode 4 and reach the substrate 1. However, herein, those ions are neglected. Namely, it is assumed that the gate electrode 4 completely blocks ion beams 9 to this region.

Next, as illustrated in FIG. 2B, in the second ion implantation, ions are ejected from the left-hand side of the gate electrode 4 with the tilt angle of θ. In this case, the distribution symmetric about the center axis of the gate electrode 4 relative to the distribution formed by the first ion implantation from the right-hand side is formed.

Next, as illustrated in FIG. 2C, in the third and the fourth ion implantations, ions are ejected from the front and the rear sides with the tilt angle of θ. The tilt angle θ is the same in both the third and the fourth ion implantations. As the result, the formed distribution may be easily treated as the distribution formed by multiplying a known distribution on an infinite plane by a distribution in the lateral direction.

First, the region $a_1$ is described with reference to FIGS. 3 and 4. In the following, a dose amount $\phi$ is defined relative to a surface orthogonal to the beam axis. Also, coordinates (t,s) are provided based on the beam axis and coordinates (x,y) are provided based on a substrate surface. As described below, the impurity concentration in this region $a_1$ does not depend on "x", but is expressed as a function of "y". Therefore, the original point D (as in FIG. 3) is determined for convenience purposes only. Namely, the original point D may be determined at (moved to) any other appropriate point.

Figure 3:
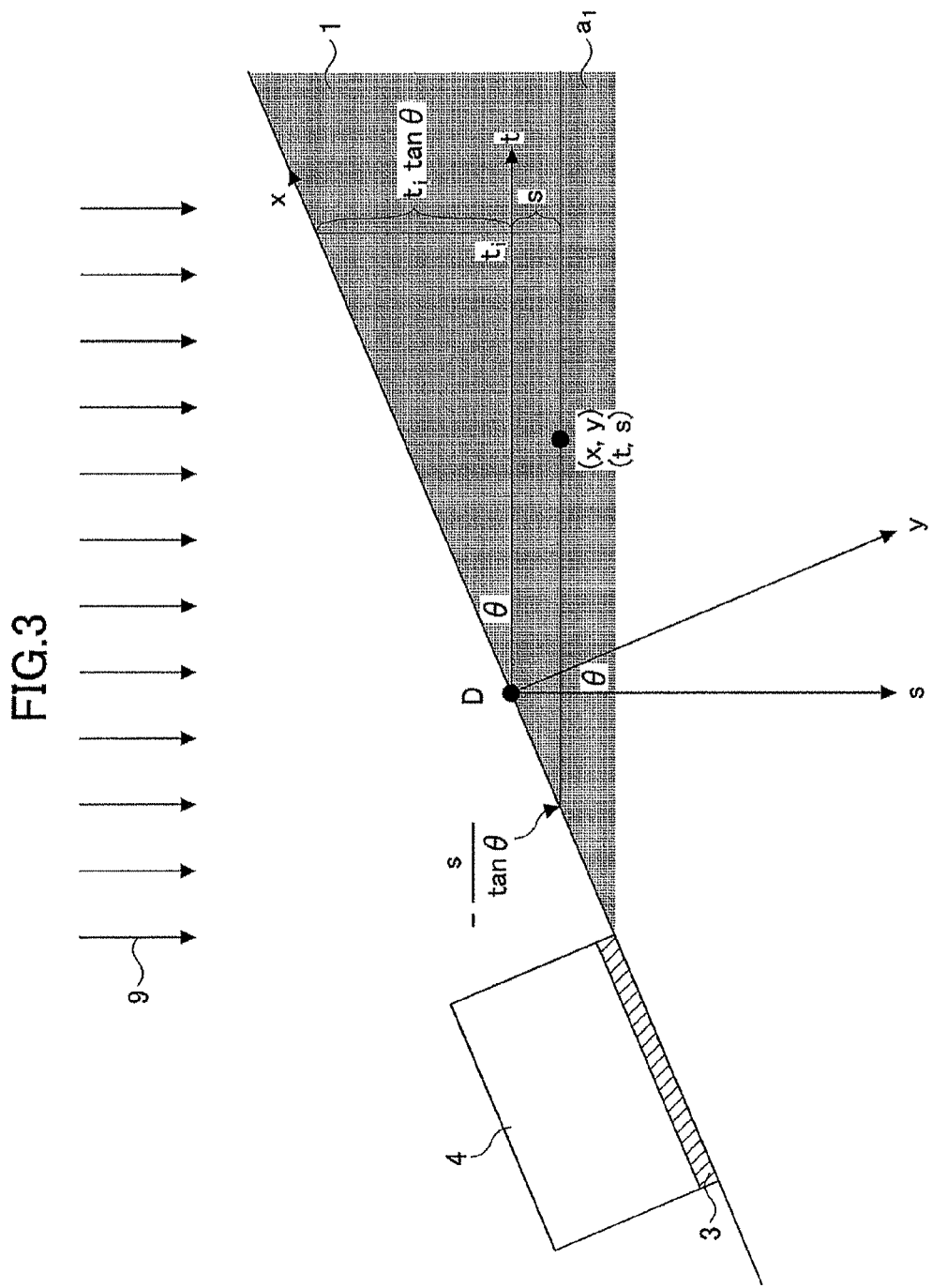
FIG. 3 illustrates an example status of the ion implantation into a region $a_1$.

In this case of FIG. 3, the original point D is set at the position apart from the gate edge (i.e., the electrode edge) to make it easier to consider (describe) the case. An impurity concentration $N_{4\_R90}$ at a position (t,s) is thought of as a sum of the contributions of the ions implanted to the area between $t=t_i$ and $t=t_i+dt_i$ to the position (t,s). As illustrated in FIG. 3, as $t_i$, a range from "$-s/\tan\theta$" which is an edge part of the surface of the substrate 1 to ∞ which is the right edge is considered. Accordingly, the following formula (7) is given.

$$N_{4\_R90\_a_1}(t,s) = \Phi \int_{-s/\tan\theta}^{\infty} \frac{1}{\sqrt{2\pi}\,\Delta R_p} \exp\left[-\frac{(s+t_i\tan\theta - R_p)^2}{2\Delta R_p^2}\right] \tag{7}$$

$$\frac{1}{\sqrt{2\pi}\,\Delta R_{pt}} \exp\left[-\frac{(t-t_i)^2}{2\Delta R_{pt}^2}\right] dt_i$$

$$= \left\{\frac{1}{2} + \frac{1}{2}\mathrm{erf}\left[\frac{1}{\sqrt{2}\,\sigma_1 \Delta R_p \Delta R_{pt}}\left(s\Delta R_p^2 \frac{\cos\theta}{\tan\theta} + t\Delta R_p^2\cos\theta + R_p\Delta R_{pt}^2\sin\theta\right)\right]\right\} \times$$

$$\frac{\Phi\cos\theta}{\sqrt{2\pi}\,\sigma_1} \exp\left[-\frac{[(s-R_p)\cos\theta + t\sin\theta]^2}{2\sigma_1^2}\right]$$

In formula (7), the symbol "erf( )" denotes an error function. Further, herein the following formula (8) is satisfied.

$$\sigma_1^2 = \Delta R_p^2 \cos^2\theta + \Delta R_{pt}^2 \sin^2\theta \tag{8}$$

Figure 4:
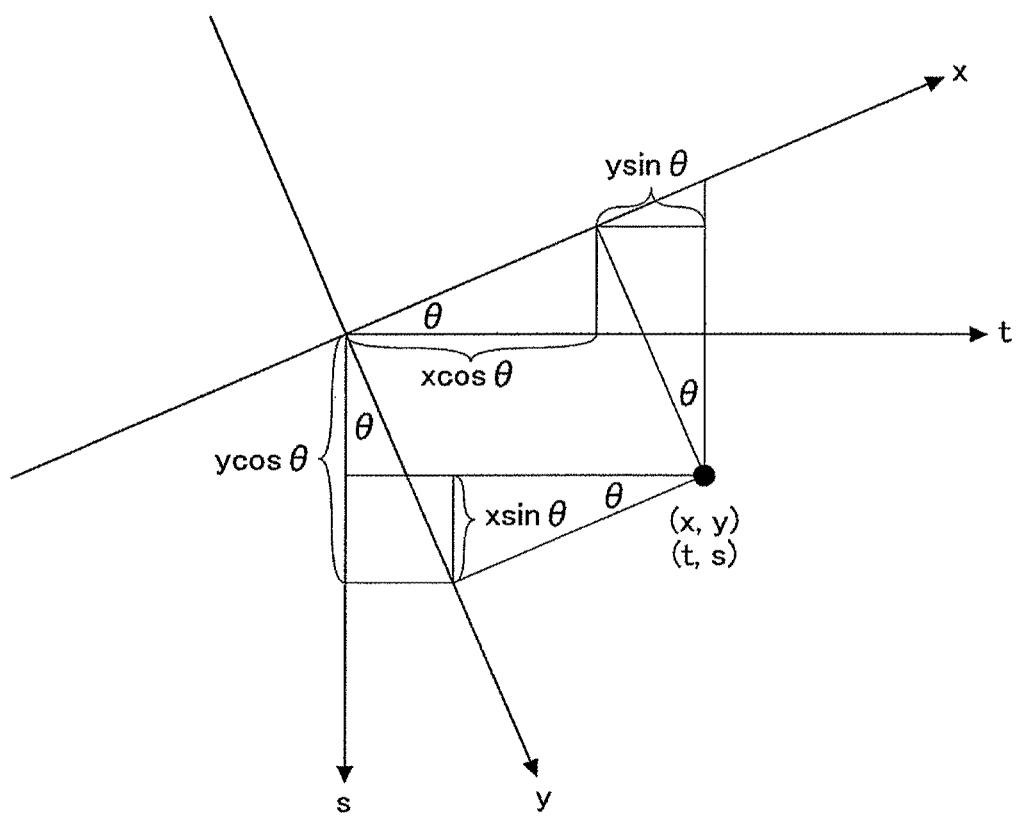
FIG. 4 illustrates an example variable transformation for a coordinate transformation.

Herein, when a variable transformation is performed with reference to FIG. 4, the following formula (9) is obtained.

$$\begin{cases} t = x\cos\theta + y\sin\theta \\ s = y\cos\theta - x\sin\theta \end{cases} \tag{9}$$

Therefore, formula (7) is transformed into the following formula (10) expressed as a function of "y" only as described above.

$$N_{4\_R90\_a_1}(x, y) = \tag{10}$$
$$\left\{ \frac{1}{2} + \frac{1}{2}\text{erf}\left[ \frac{\frac{y\Delta R_p^2}{\tan\theta} + R_p \Delta R_{pt}^2 \sin\theta}{\sqrt{2}\,\sigma_1 \Delta R_p \Delta R_{pt}} \right] \right\} \times \frac{\Phi\cos\theta}{\sqrt{2\pi}\,\sigma_1} \exp\left[ -\frac{(y - R_p\cos\theta)^2}{2\sigma_1^2} \right]$$

Figure 5:
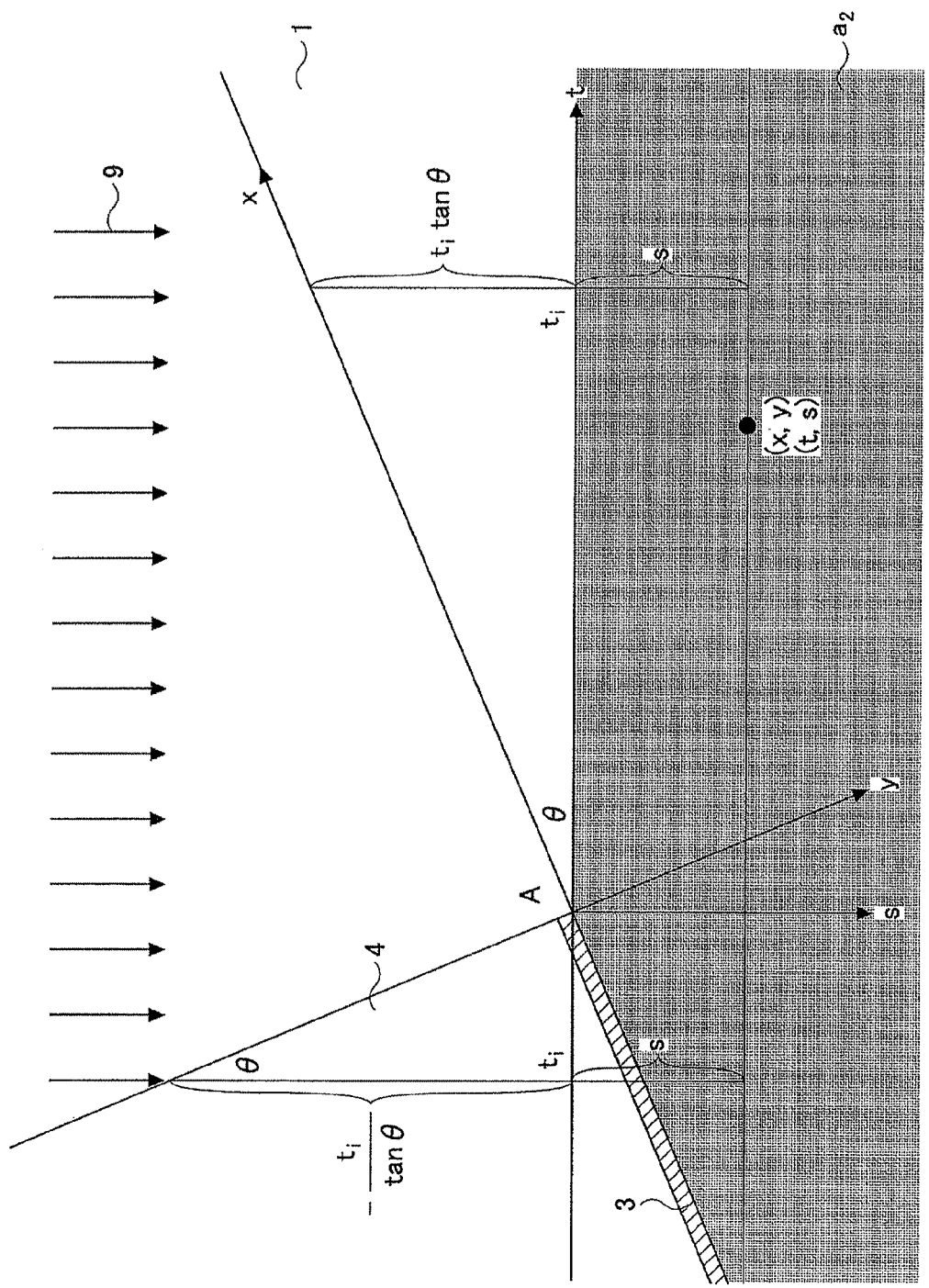
FIG. 5 illustrates an example status of the ion implantation into a region $a_2$.

Next, the region $a_2$ is described with reference to FIG. 5. The impurity concentration at a point (t,s) in this region $a_2$ is influenced by the gate electrode 4. Herein, though the gate electrode 4 has a finite height, it is assumed that the gate electrode 4 has an infinite height. This approximation is thought to be preferable because it may become possible to neglect the impurity concentration relevant to the gate electrode 4 at a certain height or higher.

In this case, the gate edge A is defined as the original point. With reference to FIG. 5, the following formula (11) is obtained.

$$N_{4\_R90\_a_2}(t, s)/\Phi = \tag{11}$$
$$\int_{-\infty}^{0} \frac{1}{\sqrt{2\pi}\,\Delta R_p} \exp\left[ -\frac{\left(s - \frac{t_i}{\tan\theta} - R_p\right)^2}{2\Delta R_p^2} \right] \frac{1}{\sqrt{2\pi}\,\Delta R_{pt}}$$
$$\exp\left[ -\frac{(t - t_i)^2}{2\Delta R_{pt}^2} \right] dt_i + \int_0^{\infty} \frac{1}{\sqrt{2\pi}\,\Delta R_p}$$
$$\exp\left[ -\frac{(s + t_i\tan\theta - R_p)^2}{2\Delta R_p^2} \right] \frac{1}{\sqrt{2\pi}\,\Delta R_{pt}} \exp\left[ -\frac{(t - t_i)^2}{2\Delta R_{pt}^2} \right] dt_i$$

In formula (11), the first term is a part that is influenced by the side wall of the gate electrode 4, and the second term is a part that is not influenced by the gate electrode 4.

When the variable transformation is similarly performed on formula (11), the following formula (12) is obtained.

$$N_{4\_R90\_a_2}(x, y) = \tag{12}$$
$$\left\{ \frac{1}{2} - \frac{1}{2}\text{erf}\left[ \frac{y\sigma_2^2 - R_p \Delta R_{pt}^2 \cos\theta - x(\Delta R_{pt}^2 - \Delta R_p^2)\sin\theta\cos\theta}{\sqrt{2}\,\sigma_2 \Delta R_p \Delta R_{pt}} \right] \right\} \times$$
$$\frac{\Phi\sin\theta}{\sqrt{2\pi}\,\sigma_2} \exp\left[ -\frac{(x + R_p\sin\theta)^2}{2\sigma_2^2} \right] +$$
$$\left\{ \frac{1}{2} + \frac{1}{2}\text{erf}\left[ \frac{x\sigma_1^2 + R_p \Delta R_{pt}^2 \sin\theta + y(\Delta R_p^2 - \Delta R_{pt}^2)\sin\theta\cos\theta}{\sqrt{2}\,\sigma_1 \Delta R_p \Delta R_{pt}} \right] \right\} \times$$
$$\frac{\Phi\cos\theta}{\sqrt{2\pi}\,\sigma_1} \exp\left[ -\frac{(y - R_p\cos\theta)^2}{2\sigma_1^2} \right]$$

Herein, the following formula (13) is satisfied.

$$\sigma_2^2 = \Delta R_p^2 \sin^2\theta + \Delta R_{pt}^2 \cos^2\theta \tag{13}$$

Next, formula (12) at a boundary $y = x \cdot \tan\theta$ between the regions $a_1$ and $a_2$ is evaluated. In formula (12), the second term denotes the contribution from a gate pattern region. Therefore, it may be sufficient to consider the first term only. By substituting $y = x \cdot \tan\theta$ into the first term of formula (13) to eliminate x, the following formula (14) is obtained.

$$N_{4\_R90\_a_2}(x, y) = \tag{14}$$
$$\left\{ \frac{1}{2} + \frac{1}{2}\text{erf}\left[ \frac{\frac{y}{\tan\theta}\sigma_1^2 + R_p \Delta R_{pt}^2 \sin\theta + (\Delta R_p^2 - \Delta R_{pt}^2)\sin\theta\cos\theta}{\sqrt{2}\,\sigma_1 \Delta R_p \Delta R_{pt}} \right] \right\} \times$$
$$\frac{\Phi\cos\theta}{\sqrt{2\pi}\,\sigma_1} \exp\left[ -\frac{(y - R_p\cos\theta)^2}{2\sigma_1^2} \right]$$

The difference between formulas (14) and (10) is in the numerators. When the numerator of formula (14) is calculated, the numerator of formula (14) corresponds to the numerator of formula (10) as illustrated in the following formula (15).

$$\frac{y}{\tan\theta}\sigma_1^2 + R_p \Delta R_{pt}^2 \sin\theta + y(\Delta R_p^2 - \Delta R_{pt}^2)\sin\theta\cos\theta = \tag{15}$$
$$\frac{y}{\tan\theta}(\Delta R_p^2 \cos^2\theta + \Delta R_{pt}^2 \sin^2\theta) + y(\Delta R_p^2 - \Delta R_{pt}^2)\sin\theta\cos\theta +$$
$$R_p \Delta R_{pt}^2 \sin\theta = \frac{y}{\sin\theta}(\Delta R_p^2 \cos^3\theta + \Delta R_{pt}^2 \sin^2\theta\cos\theta) +$$
$$\frac{y}{\sin\theta}(\Delta R_p^2 \sin^2\theta\cos\theta - \sin^2\theta\cos\theta\Delta R_{pt}^2) + R_p \Delta R_{pt}^2 \sin\theta =$$
$$\frac{y}{\sin\theta}[\Delta R_p^2 (\cos^3\theta + \sin^2\theta\cos\theta) + \Delta R_{pt}^2(\sin^2\theta\cos\theta - \sin^2\theta\cos\theta)] +$$
$$R_p \Delta R_{pt}^2 \sin\theta = \frac{y}{\tan\theta}\Delta R_p^2 + R_p \Delta R_{pt}^2 \sin\theta$$

Next, in formula (14) by changing $x \to x - L_G/2$ to move the original point from the gate edge to the center of the gate, the following formula (16) is obtained.

$$N_{4\_R90\_a_2}(x, y) = \tag{16}$$
$$\left\{ \frac{1}{2} - \frac{1}{2}\text{erf}\left[ \frac{y\sigma_2^2 - R_p \Delta R_{pt}^2 \cos\theta - \left(x - \frac{L_G}{2}\right)(\Delta R_{pt}^2 - \Delta R_p^2)\sin\theta\cos\theta}{\sqrt{2}\,\sigma_2 \Delta R_p \Delta R_{pt}} \right] \right\} \times$$

-continued $$\frac{\Phi\sin\theta}{\sqrt{2\pi}\,\sigma_2}\exp\left\{\left[-\frac{\left(\left(x-\frac{L_G}{2}\right)+R_p\sin\theta\right)^2}{2\sigma_2^2}\right]\right\}+$$

$$\left\{\frac{1}{2}+\frac{1}{2}\text{erf}\left[\frac{\left(x-\frac{L_G}{2}\right)\sigma_1^2+R_p\Delta R_{pt}^2\sin\theta+y(\Delta R_p^2-\Delta R_{pt}^2)\sin\theta\cos\theta}{\sqrt{2}\,\sigma_1\Delta R_p\Delta R_{pt}}\right]\right\}\times$$

$$\frac{\Phi\cos\theta}{\sqrt{2\pi}\,\sigma_1}\exp\left[-\frac{(y-R_p\cos\theta)^2}{2\sigma_1^2}\right]$$

Further, the boundary between the regions $a_1$ and $a_2$ is expressed in the following formula (17).

$$y=\left(x-\frac{L_G}{2}\right)\tan\theta \quad (17)$$

Herein, when an approximation is performed by assuming $\Delta R_p=\Delta R_{pt}$, the following simplified formula (18) is obtained.

$$N_{4\_R90\_a_2}(x,y)= \quad (18)$$

$$\left\{\frac{1}{2}-\frac{1}{2}\text{erf}\left[\frac{y-R_p\cos\theta}{\sqrt{2}\,\Delta R_p}\right]\right\}\frac{\Phi\sin\theta}{\sqrt{2\pi}\,\Delta R_p}\exp\left[-\frac{\left(\left(x-\frac{L_G}{2}\right)+R_p\sin\theta\right)^2}{2\Delta R_p^2}\right]+$$

$$\left\{\frac{1}{2}+\frac{1}{2}\text{erf}\left[\frac{\left(x-\frac{L_G}{2}\right)+R_p\sin\theta}{\sqrt{2}\,\Delta R_p}\right]\right\}\frac{\Phi\cos\theta}{\sqrt{2\pi}\,\Delta R_p}\exp\left[-\frac{(y-R_p\cos\theta)^2}{2\Delta R_p^2}\right]$$

Figure 6:
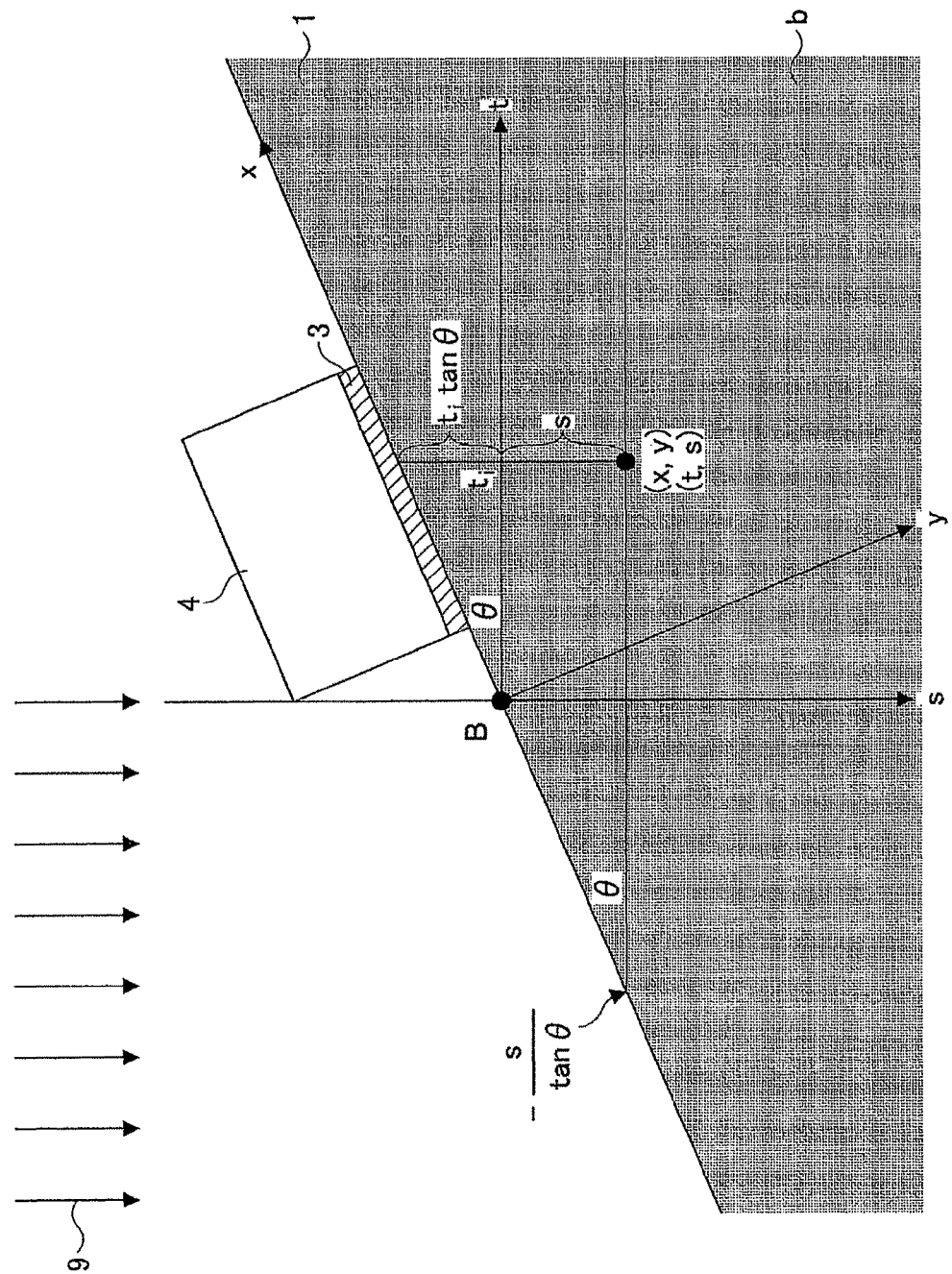
FIG. 6 illustrates an example status of the ion implantation into a region b.

Next, the shadowing area b is described with reference to FIG. 6. In this case, the original point is disposed at B. Also, it is assumed that the gate electrode 4 completely blocks the ion beams 9. In this case, by referring to FIG. 6, the following formula (19) is obtained.

$$N_{4\_R90\_b}(t,s)=\Phi\int_{-s/\tan\theta}^{0}\frac{1}{\sqrt{2\pi}\,\Delta R_p}\exp\left[-\frac{(s+t_i\tan\theta-R_p)^2}{2\Delta R_p^2}\right]\frac{1}{\sqrt{2\pi}\,\Delta R_{pt}}\exp\left[-\frac{(t-t_i)^2}{2\Delta R_{pt}^2}\right]dt_i \quad (19)$$

In this case as well, when the integration and the variable transformation are sequentially performed, the following formula (20) is obtained.

$$N_{4\_R90\_b}(x,y)=\left\{\frac{1}{2}\text{erf}\left[\frac{\frac{y\Delta R_p^2}{\tan\theta}+R_p\Delta R_{pt}^2\sin\theta}{\sqrt{2}\,\sigma_1\Delta R_p\Delta R_{pt}}\right]+ \quad (20)\right.$$

$$\frac{1}{2}\text{erf}\left[-\frac{x\sigma_1^2+R_p\Delta R_{pt}^2\sin\theta+y(\Delta R_p^2-\Delta R_{pt}^2)\sin\theta\cos\theta}{\sqrt{2}\,\sigma_1\Delta R_p\Delta R_{pt}}\right]\right\}\times$$

$$\frac{\Phi\cos\theta}{\sqrt{2\pi}\,\sigma_1}\exp\left[-\frac{(y-R_p\cos\theta)^2}{2\sigma_1^2}\right]$$

Since the distance between the original point B and the center of the gate is given as $d_g\cdot\tan\theta+L_G/2$, when the original point B is moved to the center of the gate, the following formula (21) is obtained.

$$N_{4\_R90\_b}(x,y)=\left\{\frac{1}{2}\text{erf}\left[\frac{\frac{y\Delta R_p^2}{\tan\theta}+R_p\Delta R_{pt}^2\sin\theta}{\sqrt{2}\,\sigma_1\Delta R_p\Delta R_{pt}}\right]+ \quad (21)\right.$$

$$\frac{1}{2}\text{erf}\left[-\frac{\left(x+d_G\tan\theta+\frac{L_G}{2}\right)\sigma_1^2+R_p\Delta R_{pt}^2\sin\theta+y(\Delta R_p^2-\Delta R_{pt}^2)\sin\theta\cos\theta}{\sqrt{2}\,\sigma_1\Delta R_p\Delta R_{pt}}\right]\right\}\times$$

$$\frac{\Phi\cos\theta}{\sqrt{2\pi}\,\sigma_1}\exp\left[-\frac{(y-R_p\cos\theta)^2}{2\sigma_1^2}\right]$$

When the tilt angle is large, the impurity distribution in the region b is disposed far from the active region of the device, and finally the source region 8a and the drain region 8b are covered with the pocket ion implantation distribution. Because of the reasons, in this case, the region b may not be important. However, when the tilt angle is small, it is necessary to express the ultimate condition where $\theta=0$. Therefore, it may be necessary to consider the ultimate condition to maintain the generality of the formula.

In formula (21), when approaching (assuming) the ultimate condition where $\theta=0$, the following formula (23), which corresponds to the one side of the formula (3), is obtained.

$$N_{4\_R90\_b}(x,y)=\left\{\frac{1}{2}-\frac{1}{2}\text{erf}\left[\frac{x+\frac{L_G}{2}}{\sqrt{2}\,\Delta R_{pt}}\right]\right\}\frac{\Phi}{\sqrt{2\pi}\,\Delta R_p}\exp\left[-\frac{(y-R_p)^2}{2\Delta R_p^2}\right] \quad (22)$$

In this case as well, when an approximation is performed by assuming $\Delta R_p=\Delta R_{pt}$ in formula (21) the following simplified formula (23) is obtained.

$$N_{4\_R90\_b}(x,y)= \quad (23)$$

$$\left\{\frac{1}{2}\text{erf}\left[\frac{\frac{y}{\tan\theta}+R_p\sin\theta}{\sqrt{2}\,\Delta R_p^2}\right]+\frac{1}{2}\text{erf}\left[-\frac{\left(x+d_G\tan\theta+\frac{L_G}{2}\right)+R_p\sin\theta}{\sqrt{2}\,\Delta R_p^2}\right]\right\}\times$$

$$\frac{\Phi\cos\theta}{\sqrt{2\pi}\,\Delta R_p^2}\exp\left[-\frac{(y-R_p\cos\theta)^2}{2\Delta R_p^2}\right]$$

By adding the distributions in the regions one by one, the impurity concentration distribution by the first ion implantation is obtained. The pocket ion implantation concentration distribution $N_{4\_R270}$ in the second ion implantation at a rotational angle of 270 deg. is thought to be symmetric about the center of the gate relative to the distribution $N_{4\_R90}$. Therefore, the following formula (24) is obtained.

$$N_{4\_R270}(x,y) = N_{4\_R90}(-x,y) \qquad (24)$$

In this case, the boundary between the regions $a_1$ and $a_2$ is expressed in the following formula (25).

$$y = \left(-x - \frac{L_G}{2}\right)\tan\theta \qquad (25)$$

Next, the third and the fourth pocket ion implantation distributions are described. In those cases, it is not necessary to consider the ion beams 9 blocked by the gate electrode 4 due to the tilt angle. Therefore, similar to formula (3), the ion implantation distributions in the third and the fourth ion implantation are expressed in the following formula (26).

$$N_{4\_R0,180}(x,y) = \left[1 - \frac{\mathrm{erf}\left(\frac{\frac{L_G}{2}-x}{\sqrt{2}\Delta R_{pt}}\right) + \mathrm{erf}\left(\frac{\frac{L_G}{2}+x}{\sqrt{2}\Delta R_{pt}}\right)}{2}\right] \qquad (26)$$

$$\frac{\Phi}{\sqrt{2\pi}\,\sigma_1}\exp\left[-\frac{(y-R_p\cos\theta)^2}{2\sigma_1^2}\right]$$

By summing the impurity concentration distributions in the above ion implantation processes based on the following formula (27), it may become possible to analytically obtain the pocket ion implantation distribution which is the ion implantation distribution at a large tilt angle as the Gauss distribution.

$$N_4 = \sum_R N_{4\_R} \qquad (27)$$

Therefore, by superimposing (summing) this pocket ion implantation distribution, the impurity concentration in the substrate expressed in formula (1), the channel ion implantation distribution expressed in formula (2), the extension region ion implantation distribution expressed in formula (3), and the ion implantation distribution in the source region 8a and the drain region 8b expressed in formula (4), it may become possible to analytically express the impurity concentration distribution in the MOSFET.

Accordingly, when the analytical model is used, it may become possible to obtain Gauss distribution expressing a state close to the actual impurity concentration distribution as the Gauss distribution used in the inverse modeling. Because of this feature, it may become possible to feedback to the actual process conditions.

As described above, the above analytical model is obtained when the distribution along the direction of the axis of the ion implantation direction is the Gauss distribution. However, such an analytical model may not be obtained based on a generally-used Pearson distribution and a tail function. To resolve this problem, in the following, it is considered to extend the model to such a general distribution.

When the model obtained by assuming the Gauss distribution is described again, the distribution in the region $a_1$ is described in the following formula (28).

$$N_{4\_R90\_a_1}(x,y) = \qquad (28)$$

$$\left\{\frac{1}{2} + \frac{1}{2}\mathrm{erf}\left[\frac{\frac{y\Delta R_p^2}{\tan\theta} + R_p\Delta R_{pt}^2\sin\theta}{\sqrt{2}\,\sigma_1\Delta R_p\Delta R_{pt}}\right]\right\} \times \frac{\Phi\cos\theta}{\sqrt{2\pi}\,\sigma_1}\exp\left[-\frac{(y-R_p\cos\theta)^2}{2\sigma_1^2}\right]$$

Further, the distribution in the region $a_2$ is described in the following formula (29).

$$N_{4\_R90\_a_2}(x,y) = \qquad (29)$$

$$\left\{\frac{1}{2} - \frac{1}{2}\mathrm{erf}\left[\frac{y\sigma_2^2 - R_p\Delta R_{pt}^2\cos\theta - \left(x-\frac{L_G}{2}\right)(\Delta R_{pt}^2 - \Delta R_p^2)\sin\theta\cos\theta}{(\sqrt{2}\,\sigma_2\Delta R_p\Delta R_{pt})}\right]\right\} \times$$

$$\frac{\Phi\sin\theta}{\sqrt{2\pi}\,\sigma_2}\exp\left[-\frac{\left(\left(x-\frac{L_G}{2}\right)+R_p\sin\theta\right)^2}{2\sigma_2^2}\right] +$$

$$\left\{\frac{1}{2} + \frac{1}{2}\mathrm{erf}\left[\frac{\left(x-\frac{L_G}{2}\right)\sigma_1^2 + R_p\Delta R_{pt}^2\sin\theta + y(\Delta R_p^2 - \Delta R_{pt}^2)\sin\theta\cos\theta}{(\sqrt{2}\,\sigma_1\Delta R_p\Delta R_{pt})}\right]\right\} \times$$

$$\frac{\Phi\cos\theta}{\sqrt{2\pi}\,\sigma_1}\exp\left[-\frac{(y-R_p\cos\theta)^2}{2\sigma_1^2}\right]$$

Further, the distribution in the region b is described in the following formula (30).

$$N_{4\_R90\_b}(x,y) = \left\{\frac{1}{2}\mathrm{erf}\left[\frac{\frac{y\Delta R_p^2}{\tan\theta} + R_p\Delta R_{pt}^2\sin\theta}{\sqrt{2}\,\sigma_1\Delta R_p\Delta R_{pt}}\right] + \right. \qquad (30)$$

$$\left. \frac{1}{2}\mathrm{erf}\left[-\frac{\left(x+d_G\tan\theta+\frac{L_G}{2}\right)\sigma_1^2 + R_p\Delta R_{pt}^2\sin\theta + y(\Delta R_p^2 - \Delta R_{pt}^2)\sin\theta\cos\theta}{\sqrt{2}\,\sigma_1\Delta R_p\Delta R_{pt}}\right]\right\} \times$$

$$\frac{\Phi\cos\theta}{\sqrt{2\pi}\,\sigma_1}\exp\left[-\frac{(y-R_p\cos\theta)^2}{2\sigma_1^2}\right]$$

In the above distributions, when $N_{p1}(y)$ and $N_{p2}(x)$ are expressed in the following formulas (31) and (32), respectively, $N_{p1}(y)$ and $N_{p2}(x)$ denote the projected distributions in the y axis and the x axis, respectively of the respective distributions. Further, the function described in the front of the formula is a term expressing the straggling of the distribution.

$$N_{p1}(y) = \frac{\Phi\cos\theta}{\sqrt{2\pi}\,\sigma_1}\exp\left[-\frac{(y-R_p\cos\theta)^2}{2\sigma_1^2}\right] \qquad (31)$$

$$N_{p2}(x) = \frac{\Phi\sin\theta}{\sqrt{2\pi}\,\sigma_2}\exp\left[-\frac{\left(\left(x-\frac{L_G}{2}\right)+R_p\sin\theta\right)^2}{2\sigma_2^2}\right] \qquad (32)$$

Herein, an approximation is performed by assuming that the term reflecting the straggling of the distribution is common to any distributions. Herein, it is considered that a projection function is extended to any function system. In this case, when the region $a_1$ is considered, the consideration may also be applied easily to the other regions. Therefore, by substituting formula (31) into formula (28), the distribution corresponding to the region $a_1$ is expressed in the following formula (33).

$$N_{4\_R90\_a_1}(x, y) = \left\{ \frac{1}{2} + \frac{1}{2} \text{erf} \left[ \frac{\frac{y \Delta R_p^2}{\tan\theta} + R_p \Delta R_{pt}^2 \sin\theta}{\sqrt{2} \, \sigma_1 \Delta R_p \Delta R_{pt}} \right] \right\} \times N_{p1}(y) \quad (33)$$

The projection to the y axis corresponds to the transformation of the moments as described in the following formula (34).

$$\Phi \to \Phi \cos\theta \quad (34)$$
$$R_p \to R_p \cos\theta$$
$$\Delta R_p \to \sqrt{\Delta R_p^2 \cos^2\theta + \Delta R_{pt}^2 \sin^2\theta}$$
$$\gamma(=0) \to \gamma(=0)$$
$$\beta(=3) \to \beta(=3)$$

Therefore, also in the Pearson distribution and the tail function, similar to formula (33), the distribution N(y) in the region $a_1$ is expressed in the following formula (35).

$$N_{4\_R90\_a_1}(x, y) = \left\{ \frac{1}{2} + \frac{1}{2} \text{erf} \left[ \frac{\frac{y \Delta R_p^2}{\tan\theta} + R_p \Delta R_{pt}^2 \sin\theta}{\sqrt{2} \, \sigma_1 \Delta R_p \Delta R_{pt}} \right] \right\} \times N_{p1}(y) \quad (35)$$

Herein, it is assumed that the projected distribution $N_p(y)$ in formula (35) may be approximated in the same function form of the distribution along the axis based on the transformations of the parameters as described in the following formula (36).

$$\Phi \to \Phi \cos\theta \quad (36)$$
$$R_p \to R_p \cos\theta$$
$$\Delta R_p \to \sqrt{\Delta R_p^2 \cos^2\theta + \Delta R_{pt}^2 \sin^2\theta}$$
$$\gamma \to ?$$
$$\beta \to ?$$

In the case of the Gauss distribution, the high-order moments $\gamma$ and $\beta$ are set to be constant as $(\gamma,\beta)=(0,3)$ because of the same values in the vertical and the lateral directions. However, when the Pearson distribution is used in the vertical direction, the values $(\gamma,\beta)$ of the Gauss distribution becomes different from $(\gamma,\beta)=(0,3)$.

However, since the distribution in the lateral direction is assumed to be the Gauss distribution, when assuming that $\theta$ is $\pi/2$, this corresponds to the distribution in the lateral direction. Therefore, in this ultimate condition, the following formula (37) is to be satisfied.

$$\lim_{\theta \to \frac{\pi}{2}} \gamma = 0, \lim_{\theta \to \frac{\pi}{2}} \beta = 3 \quad (37)$$

It may be mathematically difficult to analytically obtain an angle dependency of the moment in the distribution directly using the Pearson distribution. Therefore, as described below, it is considered that the angle dependency is approximately and analytically treated through a Joined half Gauss distribution having a high-order moment information. Herein, by using parameters of the Pearson distribution which is a distribution in the vertical direction, approximation is performed to the Joined half Gauss distribution expressed in the following formula (38) to identify the relevant parameters.

$$N(y) = \begin{cases} N_m \exp\left[-\frac{(x - R_{pm})^2}{2 \Delta R_{pf}^2}\right] & \text{for } y \le R_{pm} \\ N_m \exp\left[-\frac{(x - R_{pm})^2}{2 \Delta R_{pb}^2}\right] & \text{for } y > R_{pm} \end{cases} \quad (38)$$

Wherein, the symbol "$N_m$" denotes a peak concentration, the symbol "$R_{pm}$" denotes a peak concentration position, the symbol "$\Delta R_{pf}$" denotes a straggling of a projection of a range in a front Gauss distribution that determines the distribution on the surface side of the peak concentration position, and the symbol "$\Delta R_{pb}$" denotes the straggling of the projection of the range in a rear Gauss distribution that determines the distribution on the inner side of the substrate of the peak concentration position.

In the Joined half Gauss distribution, the peak concentration position $R_{pm}$ is set equivalent to that in the Pearson distribution.

$$R_p(\text{Pearson}) + a(\text{Pearson}) \to R_{pm}(\text{Joined half Gauss}) \quad (39)$$

The relationships between the peak concentration position $R_{pm}$ and a projection distance $R_p$ are described in the following formulas (40) and (41).

$$R_{pm} - R_p = a: \text{Pearson} \quad (40)$$

$$R_{pm} - R_p = \sqrt{\frac{2}{\pi}} (\Delta R_{pb} - \Delta R_{pf}): \text{Joined half Gauss} \quad (41)$$

Based on formulas (40) and (41), the following formula (42) is obtained.

$$\Delta R_{pb} - \Delta R_{pf} = \sqrt{\frac{\pi}{2}} a \quad (42)$$

Herein, "$R_{pm}$", "$\Delta R_{pf}$", and "$\Delta R_{pb}$" in the Joined half Gauss distribution have the relationships described in the following formula (43).

$$\Delta R_p^2 = \left(1 - \frac{2}{\pi}\right)(\Delta R_{pb} - \Delta R_{pf})^2 + \Delta R_{pb} \Delta R_{pf} \quad (43)$$

Therefore, when formula (42) is substituted in this formula (43), the following formula (44) is obtained.

$$\Delta R_p^2 = \left(\frac{2}{\pi} - 1\right)a^2 + \Delta R_{pb}\Delta R_{pf} \qquad (44)$$

Based on formulas (42) and (44), the following formulas (45) and (46) are obtained.

$$\Delta R_{pf} = \sqrt{\Delta R_p^2 - \left(\frac{3\pi}{8} - 1\right)a^2} - \frac{1}{2}\sqrt{\frac{\pi}{2}}\,a \qquad (45)$$

$$\Delta R_{pb} = \sqrt{\Delta R_p^2 - \left(\frac{3\pi}{8} - 1\right)a^2} + \frac{1}{2}\sqrt{\frac{\pi}{2}}\,a \qquad (46)$$

Figure 7A:
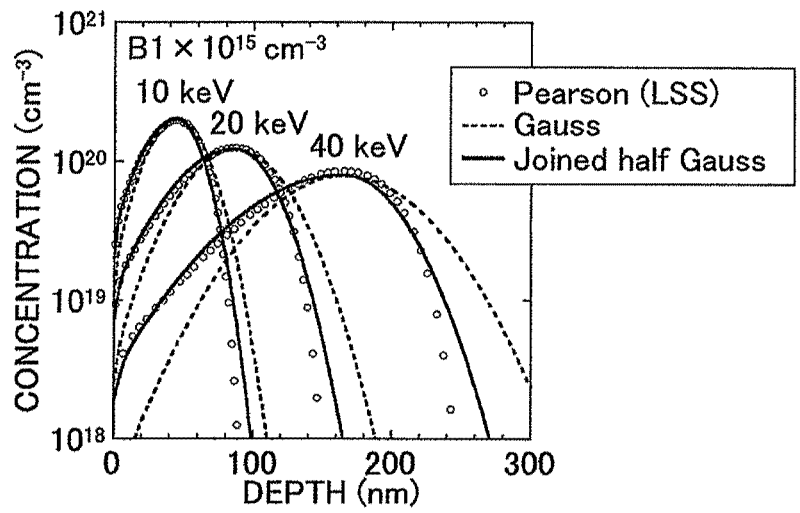
FIGS. 7A through 7C are example graphs illustrating a comparison between approximation expressions.
Figure 7B:
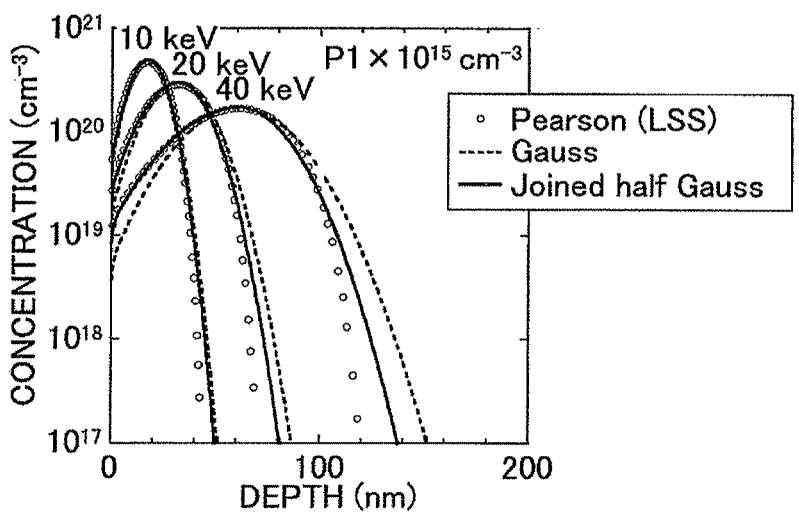
Figure 7C:
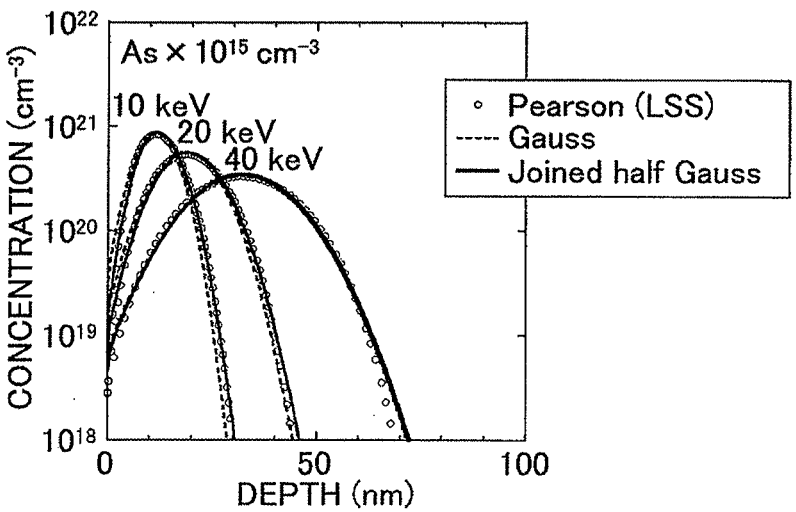

FIGS. 7A to 7C illustrate comparisons between approximation expressions approximating the Pearson function of the ion implantation distribution generated by an LSS (Lindhard, Scharff, Schiott) theory by using the Joined half Gauss distribution obtained by the above-described method. In FIGS. 7A to 7C, as a reference, data of Gauss distribution approximation using only $R_p$ and $\Delta R_p$ are also displayed. In the Gauss distribution, the symbol "$R_p$" denotes the peak concentration position and the symbol "$\Delta R_p$" denotes the peak concentration position in the Pearson distribution. As illustrated in FIG. 7A, a distribution having lower symmetry such as that of boron B may not be well expressed (approximated). As illustrated in FIG. 7B, in the Joined half Gauss distribution, in a lower concentration region, data are not sufficiently matched (approximated). However, an asymmetry property near the peak concentration is well expressed (approximated). On the other hand, as illustrated in FIG. 7C, when the distribution has high symmetry such as that of arsenic As, the Pearson distribution is well expressed (approximated) by the Gauss distribution.

In this case, γ is unambiguously determined based on a ratio $r=\Delta R_{pf}/\Delta R_{pb}$. The symbol "$\Delta R_{pf}$" denotes the straggling of the range in the front Gauss distribution, and the symbol "$\Delta R_{pb}$" denotes the straggling of the range in the rear Gauss distribution. The symbol "γ" is described in the following formula (47).

$$\gamma_{JHG} = \frac{\sqrt{\frac{2}{\pi}}(r-1)\left[\left(\frac{4}{\pi} - 1\right)(r-1)^2 + r\right]}{\left[\left(1 - \frac{2}{\pi}\right)(r-1)^2 + r\right]^{\frac{3}{2}}} \qquad (47)$$

Figure 8:
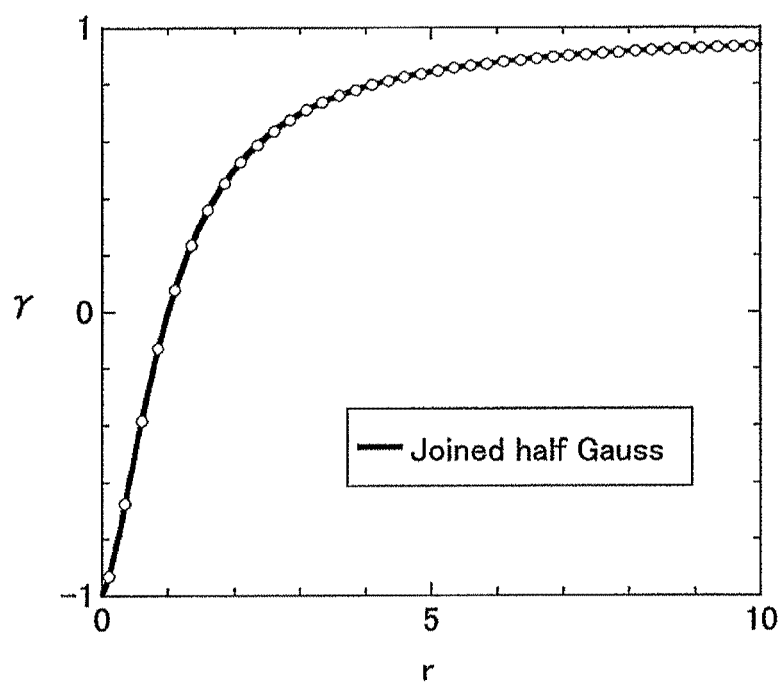
FIG. 8 illustrates an example of a limitation of $\gamma_{JHG}$.

As apparent from FIG. 8, "$\gamma_{JHG}$" has a limitation as described in the following formula (48).

$$\text{Max}[|\gamma_{JHG}|] = \lim_{r \to 0,\infty} |\gamma_{JHG}| = \frac{\sqrt{\frac{2}{\pi}}\left(\frac{4}{\pi} - 1\right)}{\left(1 - \frac{2}{\pi}\right)^{\frac{3}{2}}} = 0.995272 \qquad (48)$$

This "γ" generally differs from "γ" in the Pearson distribution. This is why different symbol "$\gamma_{JHG}$" is used.

Herein, when the tilt angle is θ, "$\Delta R_{pf}(\theta)$" and "$\Delta R_{pb}(\theta)$" are described as in the following formulas (49) and (50), respectively.

$$\Delta R_{pf}(\theta) = \sqrt{\Delta R_{pf}^2 \cos^2\theta + \Delta R_{pt}^2 \sin^2\theta} \qquad (49)$$

$$\Delta R_{pb}(\theta) = \sqrt{\Delta R_{pb}^2 \cos^2\theta + \Delta R_{pt}^2 \sin^2\theta} \qquad (50)$$

Formulas (49) and (50) explain a reason why the Pearson distribution is approximated to the Joined half Gauss distribution. Therefore, the tilt angle dependency "$\gamma_{JHG}(\theta)$" of "$\gamma_{JHG}$" is described in the following formula (51).

$$r_{JHG}(\theta) = \frac{\Delta R_{pf}(\theta)}{\Delta R_{pb}(\theta)} \qquad (51)$$

When the ratio r in formula (47) is replaced by using formula (51), the following formula (52) is obtained.

$$\gamma_{JHG}(\theta) = \frac{\sqrt{\frac{2}{\pi}}(r(\theta) - 1)\left[\left(\frac{4}{\pi} - 1\right)(r(\theta) - 1)^2 + r(\theta)\right]}{\left[\left(1 - \frac{2}{\pi}\right)(r(\theta) - 1)^2 + r(\theta)\right]^{\frac{3}{2}}} \qquad (52)$$

Herein, "γ" with the tilt angle of Pearson distribution of θ is set to "γ(θ)", an approximation is performed by assuming the relationships the ratio of "γ" and "γ(θ)" are the same in the Joined half Gauss distributions. Namely, the approximation is performed based on the following formula (53).

$$\frac{\gamma}{\gamma_{JHG}} = \frac{\gamma(\theta)}{\gamma_{JHG}(\theta)} \qquad (53)$$

Based on formula (53), the following formula (54) is obtained.

$$\gamma(\theta) = \frac{\gamma}{\gamma_{JHG}}\gamma_{JHG}(\theta) \qquad (54)$$

On the other hand, the fourth-order moment "β" is simply treated by assuming it to linearly depend on "$\gamma^2$". As described above, since γ=0 and β=3, a tilt angle (θ) dependency β(θ) of β is approximated as in the following formula (55).

$$\beta(\theta) = (\beta - 3)\frac{\gamma(\theta)^2}{\gamma^2} + 3 \qquad (55)$$

However, in a special case where γ=0, data of formula (55) becomes uncertain. In this case, the tilt angle dependency of β is evaluated by using the following formula (56) indicating a simple relationship to satisfy values in the ultimate status when θ=0, π/2.

$$\beta(\theta) = (\beta - 3)\cos^n\theta + 3 \qquad (56)$$

Where, the symbol "n" denotes a positive value. The default value of "n" is set to 1.

Further, "$\Delta R_{pt}$" generally depends on the depth. When being transformed to s, the depth y becomes y/cos θ. Therefore, it is assumed that the following formula (57) is satisfied.

$$\Delta R_{pt}(y) = \Delta R_{pt0} + m(s - R_p) \qquad (57)$$
$$= \Delta R_{pt0} + m\left(\frac{y}{\cos} - R_p\right)$$

This formula is used to replace "$\Delta R_{pt}$" in "erf" (function) of formula (35).

By approximating as described above, it may become possible to approximately define a Pearson distribution region by using the moments "$\Delta R_{pt}$", "$\gamma_{JHG}$", and "$\beta_{JHG}$" of the tail function as the moments "$\Delta R_{pt}$", "$\gamma_{JHG}$", and "$\beta_{JHG}$" of the Joined half Gauss function based on the Gauss function that can be analytically treated. Because of this feature, the Pearson distribution region may be analytically treated in the tail function. Accordingly, it may become possible to obtain the Pearson distribution region much faster than a case where the ion implantation distribution is numerical-analytically treated.

The distribution in crystal silicon is expressed using a dual Pearson distribution or the tail function. In a case of the dual Pearson distribution, the method as described above for the Pearson may be separately used for each of the two Pearson distributions. Generally, the tail function is expressed as in the following formula (58).

$$N(y) = (\Phi - \Phi_{chan})n_a(y) + \Phi_{chan}n_c(y) \qquad (58)$$

One distribution includes an amorphous part $n_a(y)$ and a channeling part $n_c(y)$ normalized by dose. The symbol "$\phi$" denotes a dose amount, and the symbol "$\phi_{chan}$" denotes a dose amount of the channeling part. The amorphous part $n_a(y)$ is expressed by the Pearson distribution and described as "$h_{ma}$" as in the following formula (59).

$$n_a(y) = h_{ma}(y) \qquad (59)$$

The channeling part $n_c(y)$ is described in the following formula (60) by using a Pearson function "$h_{mc}$" and the tail function "$h_{Tc}$" having the moment parameters same as those of the "$h_{ma}$".

$$n_c(y) = \begin{cases} h_{mc}(y) & \text{for } y \le y_T \\ \kappa[h_{mc}(y) + h_{Tc}(y)] & \text{for } y > y_T \end{cases} \qquad (60)$$

Where, "$h_{Tc}(y)$" is given as in the following formula (61). Further, the coefficient "K" in formula (60) may be obtained based on a condition to maintain the continuity of the function in "y=yT" and is described as in the following formula (62).

$$h_{Tc}(y) = h_{mc}(y_p)\exp\left[-(\ln\eta)\left(\frac{y - y_p}{L}\right)^\alpha\right] \qquad (61)$$

$$h_{mc}(y_T) = \kappa[h_{mc}(y_T) + h_{cT}(y_T)] \qquad (62)$$

The parameters in the case of the tail function composed as described above are assumed as in the following formula (63).

$$y_T = R_p + \Delta R_p \to (R_p + \Delta R_p)\cos\theta \qquad (63)$$
$$L \to L\cos\theta$$

-continued
$$\alpha \to \alpha$$

Other moments are set similar to those in the Pearson distribution.

Herein, by directly using the moments "$\Delta R_{pt}$", "$\gamma$", and "$\beta$" of the tail function as the moments "$\Delta R_{pt}$", "$\gamma$", and "$\beta$" of the Pearson distribution, the Pearson distribution is generated. Herein, this is called a tail Pearson. By using the tail Pearson, it may become possible to commonly use an established method for an existing Pearson function.

When compared with a numerical analytical approach based on a mesh size, in the analysis method described above, the impurity concentration of the region $a_1$ which is not influenced by the gate pattern, the impurity concentration of the region $a_2$ which is influenced by the gate pattern, and the impurity concentration of the region b which is shadowed by the gate are calculated without considering the mesh size. As a result, it may become possible to effectively calculate the impurity concentration.

In the above description, a simulation method of evaluating the actual impurity concentration distribution in the ion implantation is described. In the following, a method of calculating the impurity concentration distribution under ideal conditions simulated based on input ion implantation conditions is described. By using the ideal conditions, the projected region of the range in the ion implantation is generated as a box model, so that simplified calculation is achieved.

Figure 9:
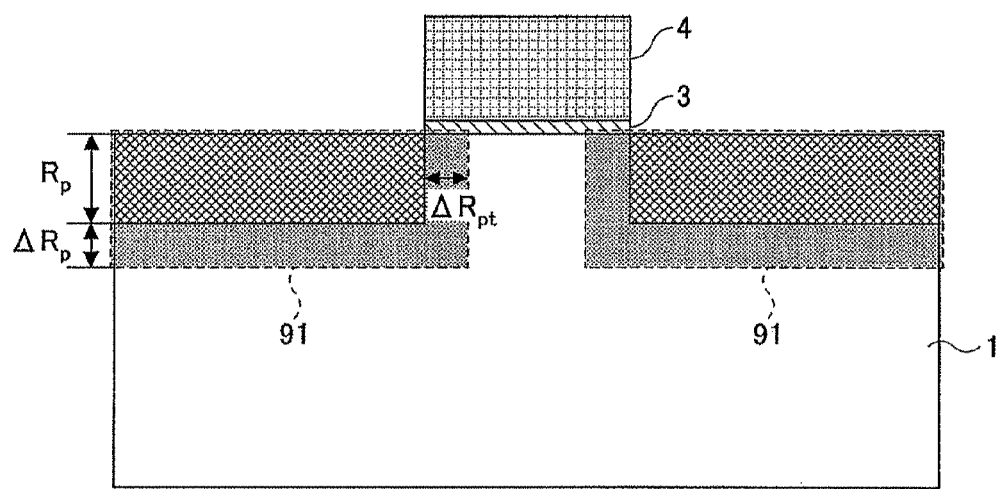
FIG. 9 illustrates a first example of a box model.

FIG. 9 illustrates a first example of the box model. In the first example of the box model in FIG. 9, a case is illustrated where distribution parameters "$R_p$", "$\Delta R_p$", and "$R_{pt}$" are read when the ion implantation conditions are input, and based on the depth $R_p + \Delta R_p$ and the straggling $\Delta R_{pt}$ of the range from the gate edge in the lateral direction, a rectangular region 91 having a constant impurity concentration N is formed in both the source region and the drain region. In this case, the impurity concentration N is described in the following formula (64) using the dose amount φ.

$$N = \frac{\Phi}{R_p + \Delta R_p} \qquad (64)$$

Otherwise, not the dose amount φ but the impurity concentration N may be input.

Figure 10:
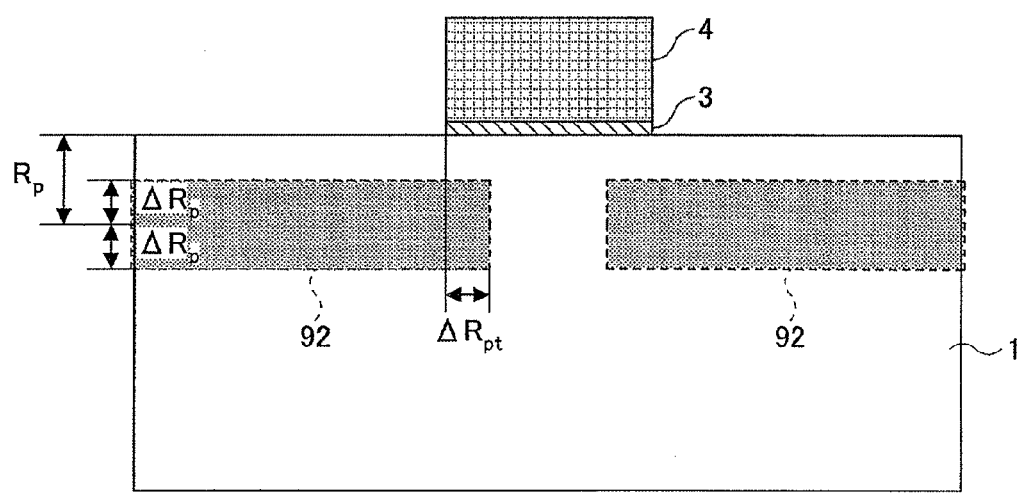
FIG. 10 illustrates a second example of the box model.

FIG. 10 illustrates a second example of the box model. In the second example of the box model in FIG. 10, a case is illustrated where the distribution parameters "$R_p$", "$\Delta R_p$", and "$\Delta R_{pt}$" are read when the ion implantation conditions are input, and the depth y is set to have a range of $R_p - \Delta R_p < y < R_p + \Delta R_p$. Then, a rectangular region 92 having a constant impurity concentration N and having straggling $\Delta R_{pt}$ of the range from the gate edge in the lateral direction is formed in both the source region and the drain region. In this case, the impurity concentration N is described in the following formula (65) using the dose amount φ.

$$N = \frac{\Phi}{2\Delta R_p} \qquad (65)$$

Otherwise, not the dose amount φ but the impurity concentration N may be input.

Though it hardly occurs, in a case of the following formula (66), the rectangular region 92 has the depth y as described in the following formula (67).

$$R_p - \Delta R_p < 0 \tag{66}$$

$$0 \leq y < R_p + \Delta R_p \tag{67}$$

Figure 11:
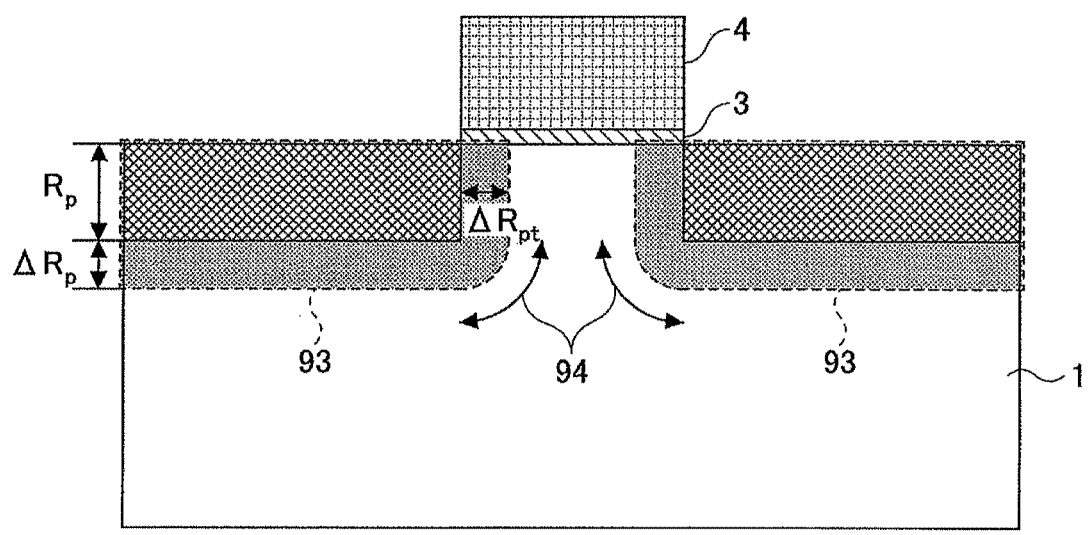
FIG. 11 illustrates a third example of the box model.

FIG. 11 illustrates a third example of the box model. In the third example of the box model in FIG. 11, a case is illustrated where the distribution parameters "$R_p$", "$\Delta R_p$", and "$\Delta R_{pt}$" are read when the ion implantation conditions are input. Then based on the depth $R_p + \Delta R_p$, the straggling $\Delta R_{pt}$ of the range from the gate edge in the lateral direction, and a junction curve 94 in consideration of sharpness of the junction, a rectangular region 93 having a constant impurity concentration N is formed in both the source region and the drain region.

According to some analyses, the sharpness of the junction may influence the device characteristics. In those studies (analyses), the Gauss distribution as described in the following formula (68) is used as the distribution in the lateral direction to express the sharpness of the distribution for the straggling $\Delta R_{pt}$ of the range from the gate edge.

$$N(x) = N_0 \exp\left(-\frac{x^2}{2\Delta R_{pt}}\right) \tag{68}$$

However, in this function, the sharpness of the junction curve 94 and the length of the transition region may vary simultaneously. As a result, it becomes uncertain whether the obtained result is associated with the sharpness of the junction curve 94 or the length of the transition region. To solve the problem, the following formulas (69) to (74) are proposed as a function system where the transition region and the sharpness may be independently analyzed and that includes the formula (68) for a special case.

First, the impurity concentration distribution N(x) from the gate edge in the lateral direction x is described in the following formula (69).

$$N(x) = N_0 \exp\left(-\ln\eta\left(\frac{x}{\Delta R_{pt}}\right)^{\alpha_t}\right) \tag{69}$$

The symbol "ln η" may be designated based on the concentration when $x = \Delta R_{pt}$ based on the following formula (70).

$$N(\Delta R_{pt}) = N_0 \exp(-\ln\eta) \tag{70}$$
$$= \frac{N_0}{\eta}$$

Similarly, the impurity concentration distribution N(y) in the depth y direction is described in the following formula (71).

$$N(y) = N_0 \exp\left(-\ln\eta\left(\frac{y}{\Delta R_p}\right)^{\alpha}\right) \tag{71}$$

For a region where $y > R_p$ and $x > 0$, the following formula (72) is used.

$$N(x, y) = N_0 \exp\left(-\ln\eta\left(\frac{x}{\Delta R_{pt}}\right)^{\alpha_t}\right)\exp\left(-\ln\eta\left(\frac{y}{\Delta R_p}\right)^{\alpha}\right) \tag{72}$$

In this case, the coordinates (x,y) using the beam axis where the impurity concentration is $N_0/\eta$ is described in the following formula (73).

$$\frac{1}{\eta} = \exp\left(-\ln\eta\left(\frac{x}{\Delta R_{pt}}\right)^{\alpha_t}\right)\exp\left(-\ln\eta\left(\frac{y}{\Delta R_p}\right)^{\alpha}\right) \tag{73}$$

Based on formula (73), the junction curve representing the junction curve 74 is expressed according to the following formula (74).

$$y = \Delta R_p \left[1 - \left(\frac{x}{\Delta R_{pt}}\right)^{\alpha_t}\right]^{\frac{1}{\alpha}} \tag{74}$$

Figure 12:
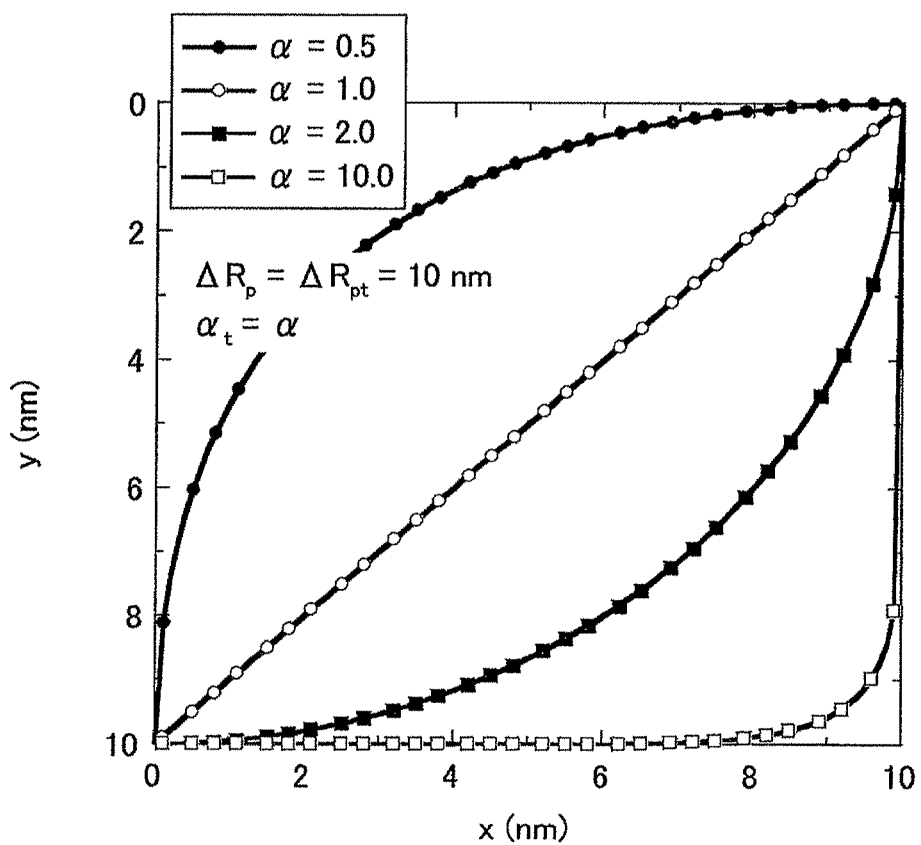
FIG. 12 is a graph illustrating an example of an a dependency of a junction curve.

The α dependency of the junction curve of formula (74) is described in FIG. 12. In FIG. 12, the vertical axis represents the depth y of the range (i.e., $\Delta R_p$), and the lateral axis represents the straggling x of the range in the lateral direction (i.e., $\Delta R_{pt}$). The unit of those axes is nm. Further, FIG. 12 illustrates the junction curve based on the formula (74) when both $\Delta R_p$ and $\Delta R_{pt}$ are 10 nm. Further, as examples, cases where α is "0.5", "1.0", "2.0", and "10.0" are illustrated.

When the tilt angle is large, the transformations of the following formula (75) are used.

$$R_p \to R_p \cos\theta \tag{75}$$
$$\Delta R_p \to \sigma_1 = \sqrt{\Delta R_p^2 \cos^2\theta + \Delta R_{pt}^2 \sin^2\theta}$$

Further, in the lateral direction, the straggling is extended by $R_p \sin\theta$ and then, the following formula (75) is used.

$$\Delta R_{pt} \to \sigma_2 = \sqrt{\Delta R_p^2 \sin^2\theta + \Delta R_{pt}^2 \cos^2\theta} \tag{76}$$

When the rectangular distribution is treated, the rectangular region 91, 92, or 93 as defined as described above is clear. In this case, the rectangular region 91, 92, or 93 is stored in a predetermined storage region of a data/program storage part 13. Then, the existing impurity concentration may be initialized to zero and replaced by the input impurity concentration distribution. Further, even in any impurity concentration distribution, when the concentration is higher than a predetermined concentration, it may become possible to initialize the concentration of the region to zero to be replaced by the input impurity concentration distribution. Namely, the following modes may be provided.

Simple addition: add

Replacement: replace

An SOI (Silicon On Insulator) device, regardless of whether it is single or double gate SOI, may be treated by ignoring the region where the depth of the model is less than SOI thickness.

As described above, the parameters are generated by working with the ion implantation conditions. Further, by changing displayed parameters, the impurity concentration distribution using the parameters may be generated.

By installing a program of the analytical models as described above into a general-purpose computer such as a personal computer, a simulator 100 described below as a device simulator or an inverse simulator may be provided.

Figure 13:
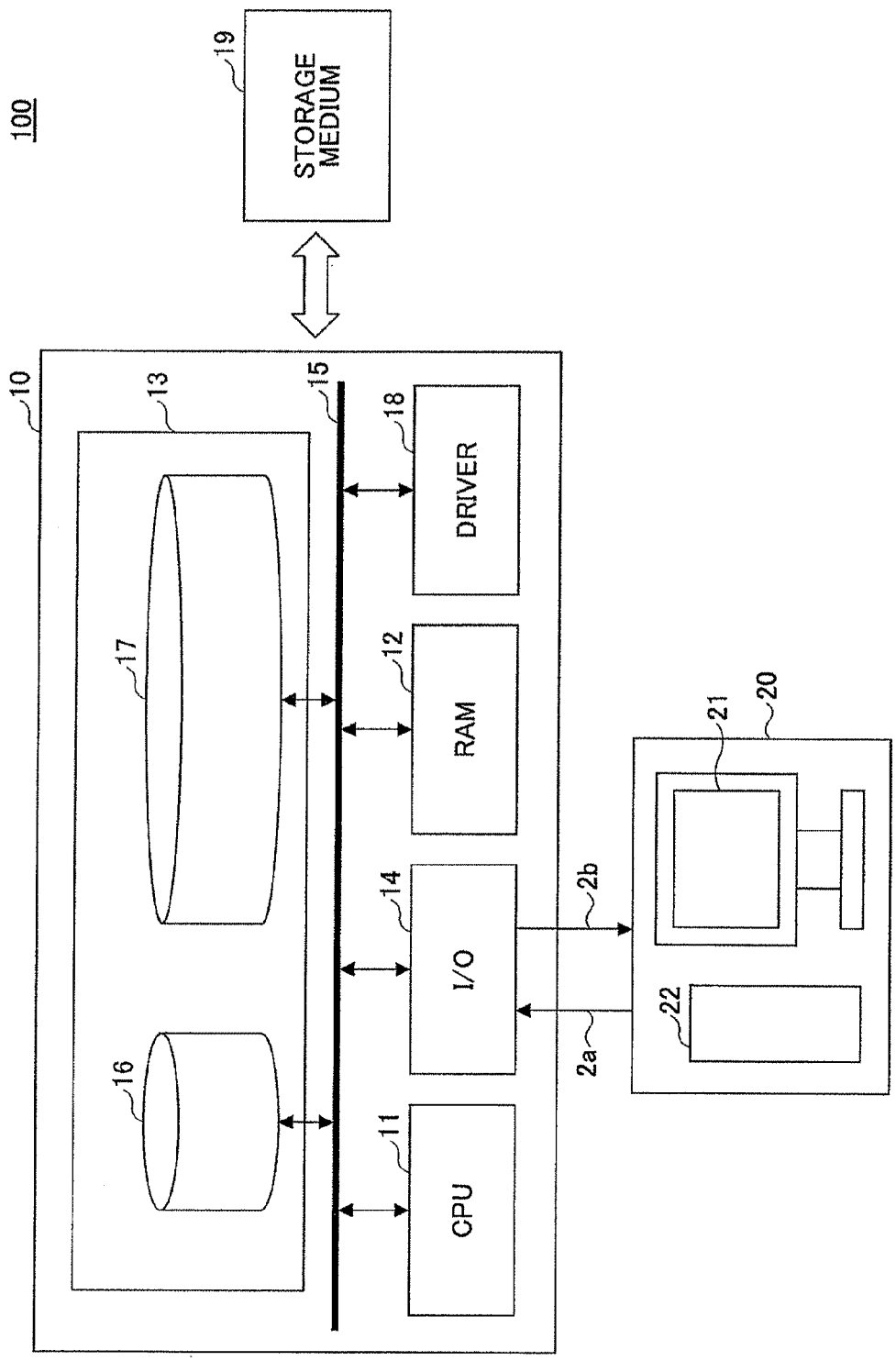
FIG. 13 is an example of a schematic configuration of a simulator simulating generation of an ion implantation distribution.

FIG. 13 schematically illustrates an example of a configuration of the simulator 100 simulating the generation of the ion implantation distribution. The simulator 100 includes a computer main body part 10 and an external output/display part 20. The computer main body part 10 includes a CPU (Central Processing Unit) 11, a RAM (Random Access Memory) 12, the data/program storage part 13, an I/O 14, and a driver 18. Those elements are connected to each other via a bus 15. The external output/display part 20 includes a monitor 21 and an external storage device 22 and is connected to the computer main body part 10 via the I/O 14.

Further, a parameter database 16 and an ion implantation distribution simulation program 17 are stored in a storage medium 19 or the like. By setting the driver 18, the parameter database 16 and the ion implantation distribution simulation program 17 are installed into the data/program storage part 13 of the simulator 100. Then when the ion implantation conditions 2a are input through a monitor screen described below with reference to FIG. 23, a calculation result indicating the ion implantation conditions 2a is output on the screen of the monitor 21 and may be stored into the external storage device 22.

Figure 14:
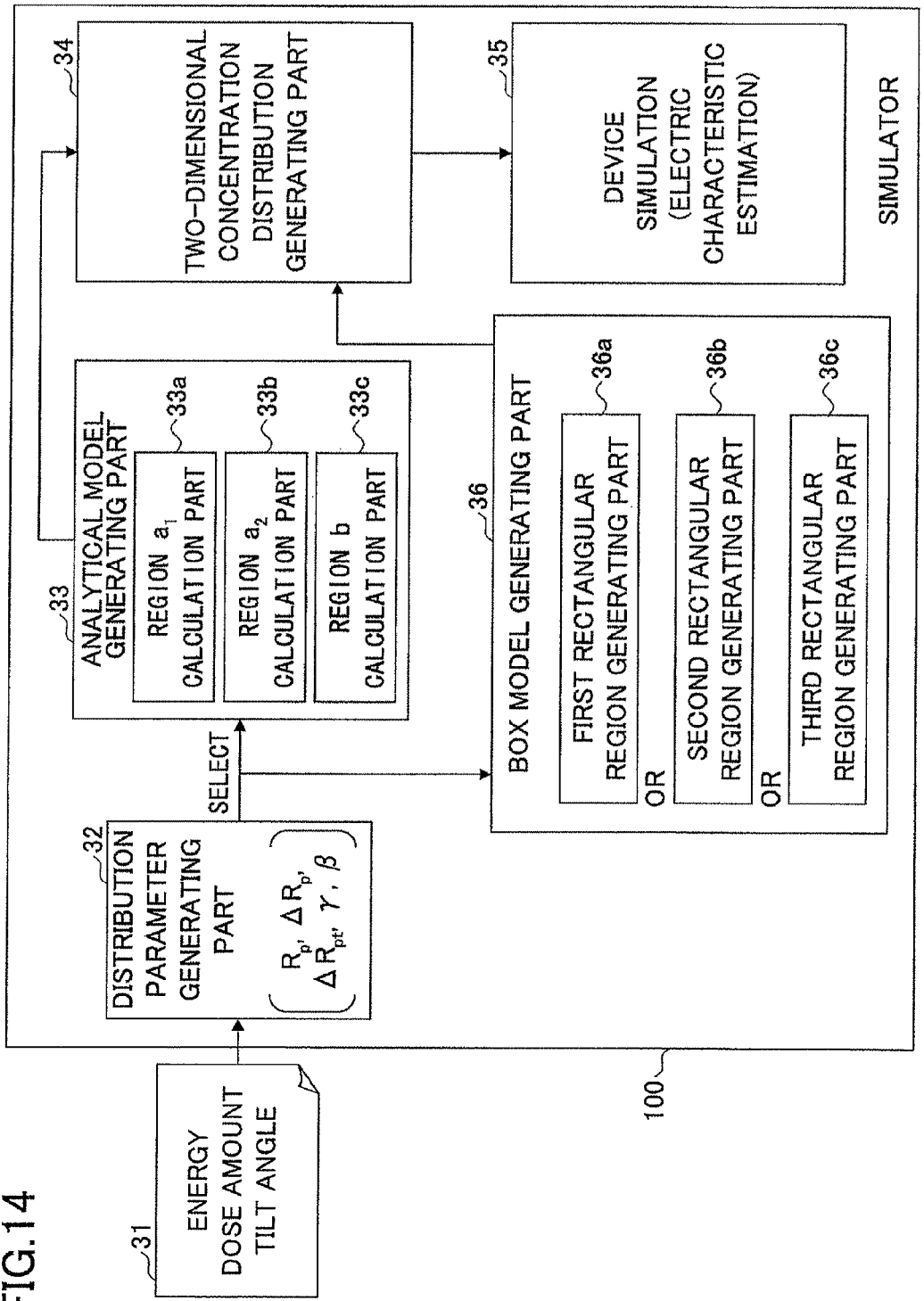
FIG. 14 is an example of a functional block diagram of a simulator device.

FIG. 14 illustrates an example of a functional block diagram of the simulator device. In FIG. 14, the simulator 100 includes a distribution parameter generating part 32, an analytical model generating part 33, a two-dimensional concentration distribution generating part 34, a device simulation 35, and a box model generating part 36.

The distribution parameter generating part 32 is a processing part that generates a projection of the range of the ion implantation "$R_p$", the straggling of the projection of the range in depth "$\Delta R_p$", the straggling of the projection of the range in the lateral direction "$\Delta R_{pt}$", and high-order moments "$\gamma$", and "$\beta$". After the distribution parameters are generated, in accordance with the selection by a user of the simulator 100, the operations of the analytical model generating part 33 or the box model generating part 36 are executed.

The analytical model generating part 33 includes a region $a_1$ calculation part 33a, a region $a_2$ calculation part 33b, and a region b calculation part 33c. The region $a_1$ calculation part 33a calculates the region $a_1$ (FIG. 3) which does not depend upon the gate pattern. The region $a_2$ calculation part 33b calculates the region $a_2$ (FIG. 5) which depends upon the gate pattern. The region b calculation part 33c calculates the region b (FIG. 6) which is shadowed by the gate electrode 4. Based on the calculated regions $a_1$, $a_2$, and b, the analytical model generating part 33 calculates a total ion implantation distribution.

The two-dimensional concentration distribution generating part 34 is a processing part that calculates the ion implantation concentration of the ion beams relative to the substrate in accordance with the mesh size. Further, by calculating for all the ion beams 9, the two-dimensional concentration distribution generating part 34 generates the two-dimensional ion implantation concentration distribution.

The device simulation 35 is a processing part that generates distribution parameters corresponding to the implantation conditions and evaluates the relevant electric characteristics.

The box model generating part 36 includes a first rectangular region generating part 36a, a second rectangular region generating part 36b and a third rectangular region generating part 36c. Further the box model generating part 36 is a processing part that generates any of the rectangular region 91 of FIG. 9, the rectangular region 92 of FIG. 10, and the rectangular region 93 of FIG. 11 as the box model.

In the simulator 100, by reading the commands of the program that is stored in the data/program storage part 13 and that realize the processing parts 32 to 36 and executing the commands by the CPU 11, the CPU 11 functions as the processing parts 32 to 36.

Figure 15:
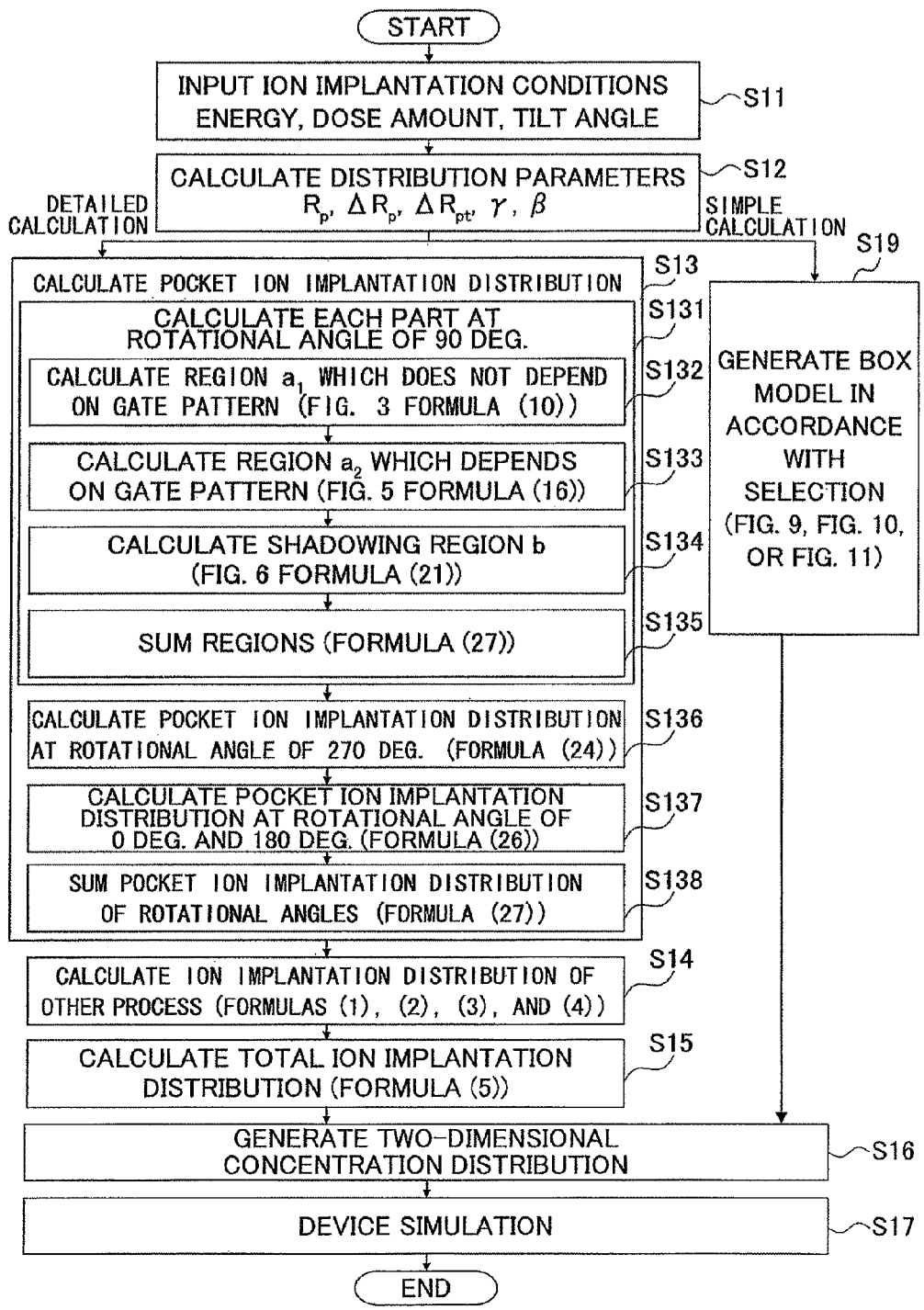
FIG. 15 is an example flowchart of generating an ion implantation concentration distribution.

FIG. 15 is a flowchart illustrating a process of generating the ion implantation concentration distribution. In FIG. 15, the ion implantation conditions are input to the simulator 100 (step S11). Based on the information indicating the energy, the dose amount, and the tilt angle included in the ion implantation conditions, by using a predetermined database, the distribution parameter generating part 32 generates "$\Delta R_p$", "$\Delta R_{pt}$", "$\gamma$", and "$\beta$" (step S12).

Next, in accordance with the selection (setting) by the user, either a detailed calculation to generate the analytical model or a simple calculation to generate the box model is executed. When the user selects the detailed calculation, the analytical model generating part 33 performs a pocket ion implantation distribution calculation (step S13). In step S13, the analytical model generating part 33 executes step 131, which includes steps S132 to S135, and step S136 through step S138 described below.

In step S131 for various calculation processes when the rotational angle is 90 deg., the analytical model generating part 33 calculates the region $a_1$ (FIG. 3) which does not depend upon the gate pattern by the region $a_1$ calculation part 33a, using, for example, formula (10) (step S132). The analytical model generating part 33 further calculates the region $a_2$ (FIG. 5) which depends upon the gate pattern by the region $a_2$ calculation part 33b using, for example, formula (16) (step S133). The analytical model generating part 33 further calculates region b (FIG. 6) which is shadowed by the gate electrode 4 by the region b calculation part 33c (step S134). Then, the analytical model generating part 33 sums the regions $a_1$, $a_2$, and b using formula (21) (step S135).

Next, the analytical model generating part 33 uses formula (24) where the rotational angle is 270 deg. to calculate the pocket ion implantation distribution (step S136), and further uses formula (26) where the rotational angle is 0 deg. and 180 deg. to calculate the respective pocket ion implantation distributions (step S137). Then, the analytical model generating part 33 uses formula (27) to sum the pocket ion implantation distributions in the respective rotational angles (step S138).

After completing the pocket ion implantation distribution calculations in step S13, the analytical model generating part 33 uses formulas (1), (2), (3), and (4) to calculate the ion implantation distributions in other processes (step S14), and uses formula (5) to calculate the total ion implantation distribution (step S15).

Then, the analytical model generating part 33 generates the two-dimensional concentration distribution (step S16), and performs device simulation (step S17) to complete the process of generating the ion implantation distribution.

When the user selects the simple calculation, after the completion of the process in step S12, the box model generating part 36 performs a process corresponding to the box model selected by the user (step S19). In step S19, when the box model as illustrated in FIG. 9 is selected by the user, the box model is generated by the first rectangular region generating part 36a. When the box model as illustrated in FIG. 10 is selected by the user, the box model is generated by the second rectangular region generating part 36b. When the box model as illustrated in FIG. 11 is selected by the user, the box model is generated by the third rectangular region generating part 36c.

Then, based on the generated model box (rectangular region 91, 92, or 93), the analytical model generating part 33 generates the two-dimensional implantation distribution (step S16), and performs device simulation (step S17) to complete the process of generating the ion implantation distribution.

Figure 16:
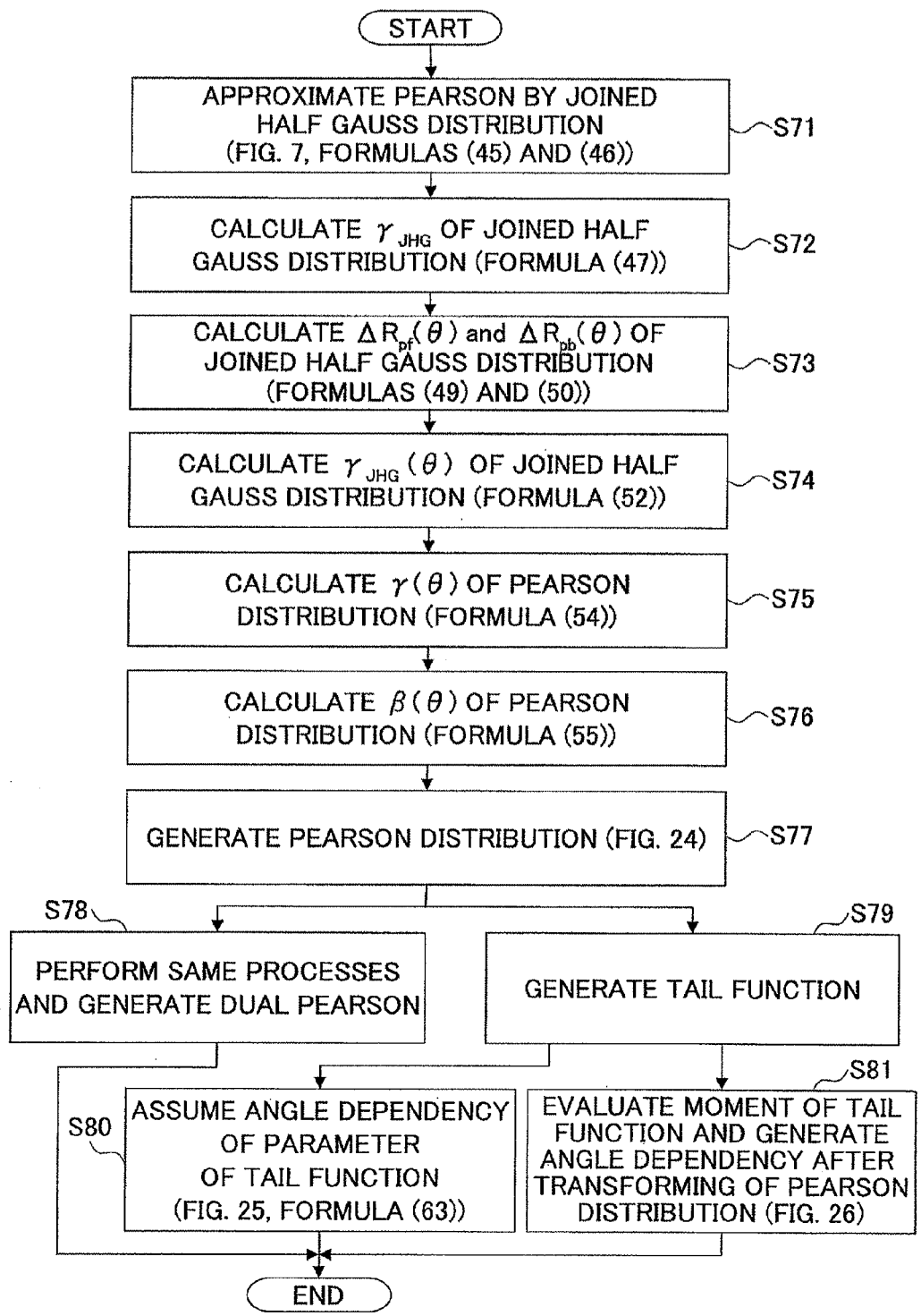
FIG. 16 is an example flowchart illustrating a function transformation process performed in a pocket ion implantation dispersion calculation process by an analytical model generating part.

FIG. 16 is a flowchart of a function transformation process executed in a pocket ion implantation dispersion calculation process by the analytical model generating part 33. In FIG. 16, the analytical model generating part 33 uses formulas (45) and (46) to approximate the Pearson distribution by the Joined half distribution (step S71). For example, the approximation may be performed as illustrated in FIGS. 7A and 7B.

Further, the analytical model generating part 33 uses formula (47) to calculate "$\gamma_{JHG}$" of the Joined half Gauss distribution (step S72). Then, the analytical model generating part 33 uses formulas (49) and (50) to calculate "$\Delta R_{pf}(\theta)$" and "$\Delta R_{pb}(\theta)$", respectively, of the Joined half Gauss distribution (step S73). Further, the analytical model generating part 33 uses formula (52) to calculate "$\gamma_{JHG}(\theta)$" of the Joined half Gauss distribution (step S74).

Figure 24A:
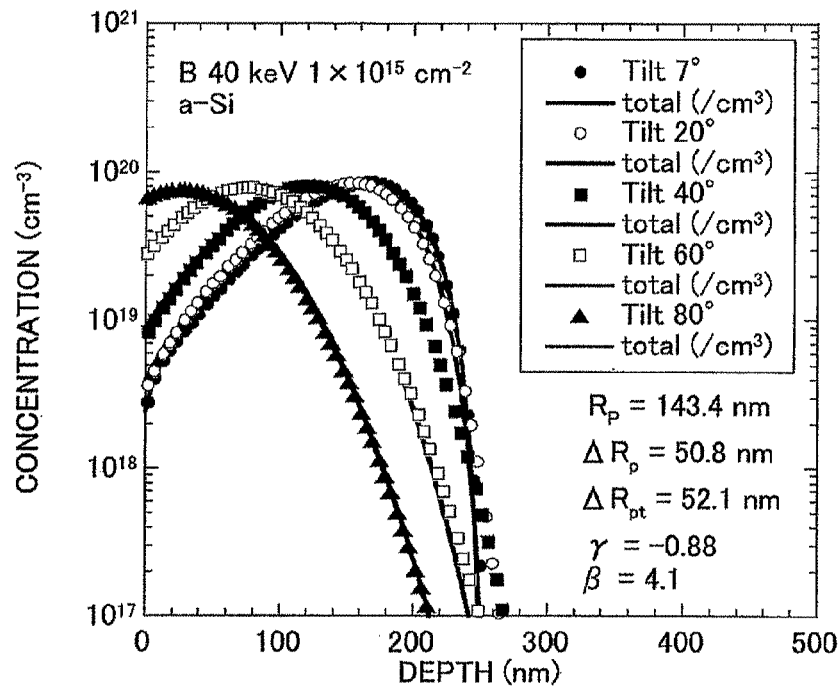
Figure 24B:
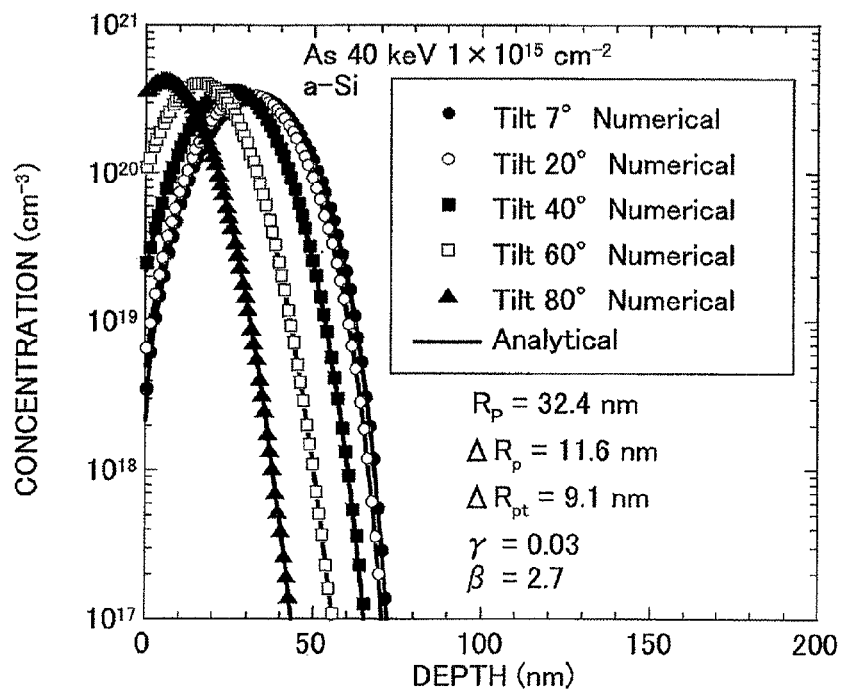

Further, the analytical model generating part 33 uses formula (54) to calculate "$\gamma(\theta)$" of the Pearson distribution (step S75), and uses formula (55) to calculate "$\beta(\theta)$" of the Pearson distribution (step S76). After that, the analytical model generating part 33 generates the Pearson distribution (step S77). For example, approximation is performed as illustrated in FIGS. 24A and 24B.

The distribution in crystal silicon is expressed using the dual Pearson distribution or the tail function. When the dual Pearson distribution is used, the analytical model generating part 33 separately applies the process in steps S71 to S77 to each of the two Pearson distributions to generate the dual Pearson distribution (step S78).

On the other hand, when the tail function is used to express the distribution in crystal silicon, the analytical model generating part 33 generates the tail function (e.g., formula (58)) (step S79). Then, the analytical model generating part 33 executes either step S80 or step S81 to extend to the tail function.

In step S80, the analytical model generating part 33 uses formula (63) to assume the angle dependency of the parameter of the tail function (FIG. 25) and completes the function transformation process. Otherwise, in step S81, the analytical model generating part 33 evaluates the moment of the tail function and performs the same processes as those for the dual Pearson distribution on the tail Pearson having been transferred to the Pearson distribution (i.e., the moment of the tail function is evaluated and the approximation is performed in the Pearson distribution to provide the dual Pearson distribution) to generate the angle dependency distribution (FIG. 26). Then, the function transformation process is completed.

By substituting the projected distribution evaluated as described above into the projected distribution of the ion implantation distribution with a large tilt angle, it may become possible to obtain the two-dimensional distribution.

[a] Example 1

Based on the above descriptions, herein, with reference to FIGS. 17 to 23, a pocket ion implantation distribution generating method as an example 1 of the present invention is described. In this case, the process conditions are described below. Based on the implantation conditions, by using the database (see above Non-Patent Documents 22 to 27), the corresponding distribution parameters are generated.

Substrate: Boron $2 \times 10^{16}$ cm$^{-3}$
Channel ion implantation: Boron 10 keV tilt 7° $2 \times 10^{13}$ cm$^{-2}$
($R_p$=38.4 nm, $\Delta R_p$=30.9 nm, $\Delta R_{pt}$=16.0 nm)
Gate pattern fabrication various gate length $L_G$ with $d_G$ of 0.1 μm.
Pocket ion implantation
Boron 5 keV tilt 28° $9 \times 10^{12}$ cm$^{-2}$
($R_p$=9.991 nm, $\Delta R_p$=20.63 nm, $\Delta R_{pt}$=9.088 nm)
or
Boron 10 keV tilt 28° $9 \times 10^{12}$ cm$^{-2}$
($R_p$=38.41 nm, $\Delta R_p$=30.9 nm, $\Delta R_{pt}$=16 nm)
Rotation 0°, 90°, 180°, and 270°
Extension ion implantation: As 3 keV tilt 0° rotation 0° $2 \times 10^{15}$ cm$^{-2}$
($R_p$=4.7 nm, $\Delta R_p$=1.9 nm, $\Delta R_{pt}$=2.0 nm)
Side wall formation 60 nm
Source/drain ion implantation: P 8 keV tilt 0° rotation 0 $2 \times 10^{15}$ cm$^{-2}$
($R_p$=9.2 nm, $\Delta R_p$=8.4 nm, $\Delta R_{pt}$=9.0 nm)

Figure 17A:
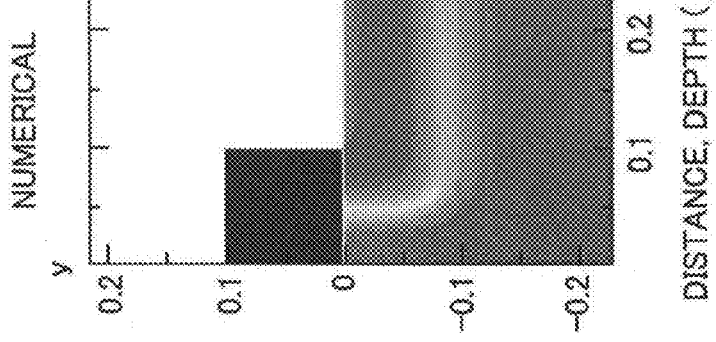
FIGS. 17A and 17B are example graphs illustrating two-dimensional impurity concentration distribution in a MOS-structure substrate.
Figure 17B:
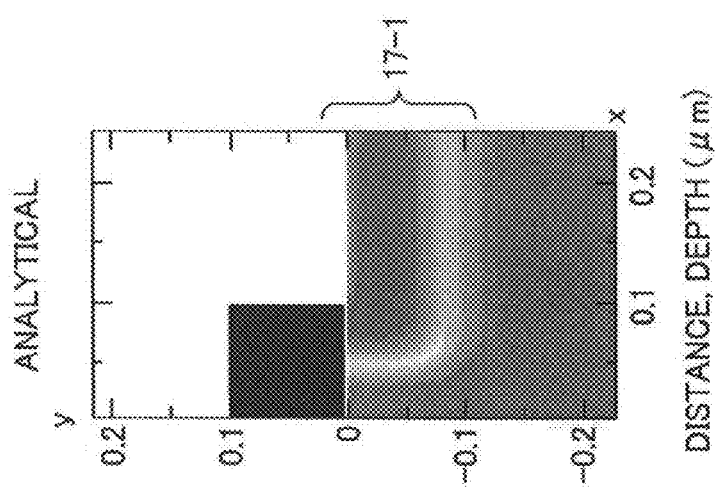

In those conditions, the impurity concentration distribution calculated by SyProS which is a process simulator incorporated in an integrated simulator HyENEXSS (Hyper Environment for Exploration of Semiconductor Simulation) (see, for example, Non-Patent Documents 28 and 29) and the two-dimensional concentration distribution based on only pocket implantation at 10 keV evaluated in the analytical model are described in FIGS. 17B and 17A, respectively. FIG. 17A is a graph illustrating the two-dimensional impurity concentration distribution in the MOS-structure substrate based on the analytical model. FIG. 17B is a graph illustrating the two-dimensional impurity concentration distribution in the MOS-structure substrate based on a numerical calculation. As illustrated in FIGS. 17A and 18B, the impurity concentration distribution 17-1 of FIG. 17A based on the analytical model substantially corresponds to the impurity concentration distribution 17-2 of FIG. 17B based on the numerical calculation.

Figure 18A:
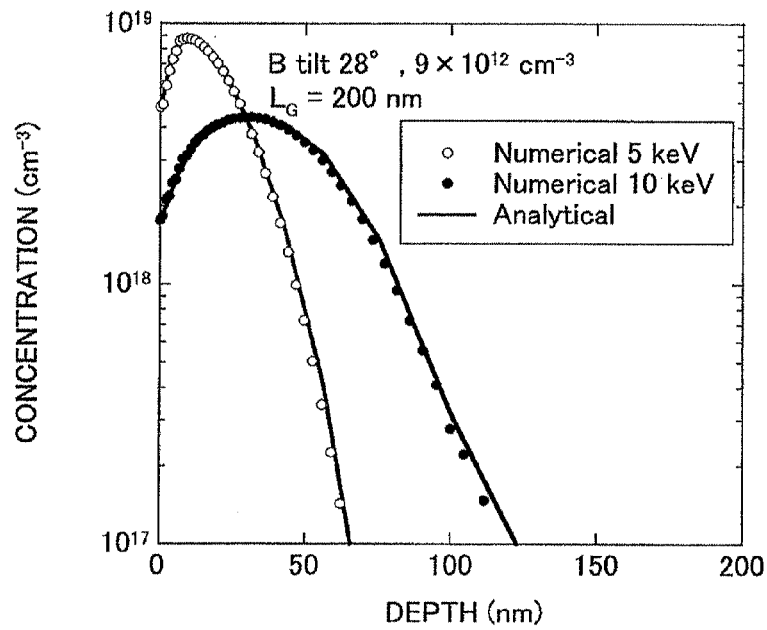
FIGS. 18A and 18B are example graphs illustrating a comparison between a distribution based on a numerical calculation by a process simulator HyPros and a distribution based on the analytical model.
Figure 18B:
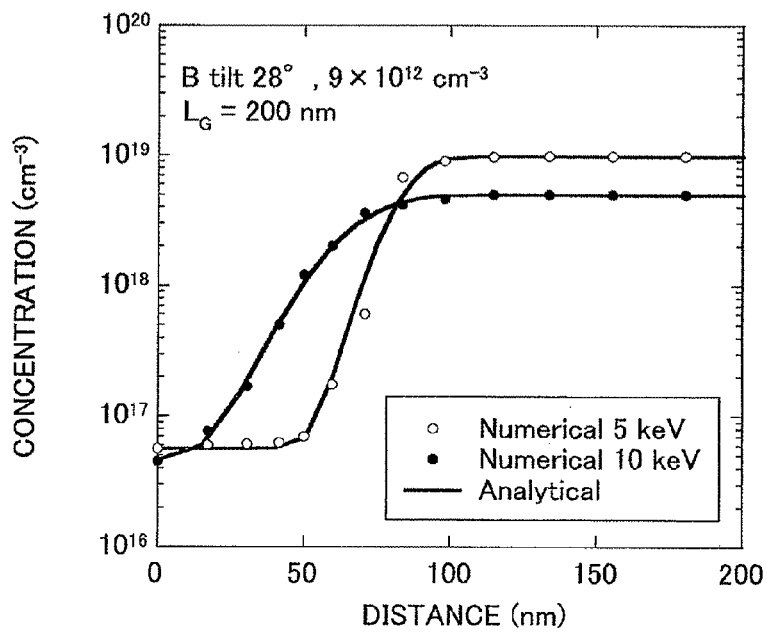

Comparisons between the distribution based in the numerical calculation by the process simulator Hypros and the distribution based on the analytical model are described in FIGS. 18A and 18B. FIG. 18A is a graph illustrating a comparison in the concentration distributions in the vertical direction at the gate edge. FIG. 18B is a graph illustrating a comparison in the concentration distributions in the lateral direction at the peak concentration position. FIG. 18A illustrates the distribution in the depth direction at the gate edge. FIG. 18B illustrates the distribution cut in the lateral direction at the depth of $R_{pc}$ cos θ. As illustrated in FIGS. 18A and 18B, the graphs of the analytical model ("Analytical") correspond well to the graphs of the numerical calculation ("Numerical").

Figure 19:
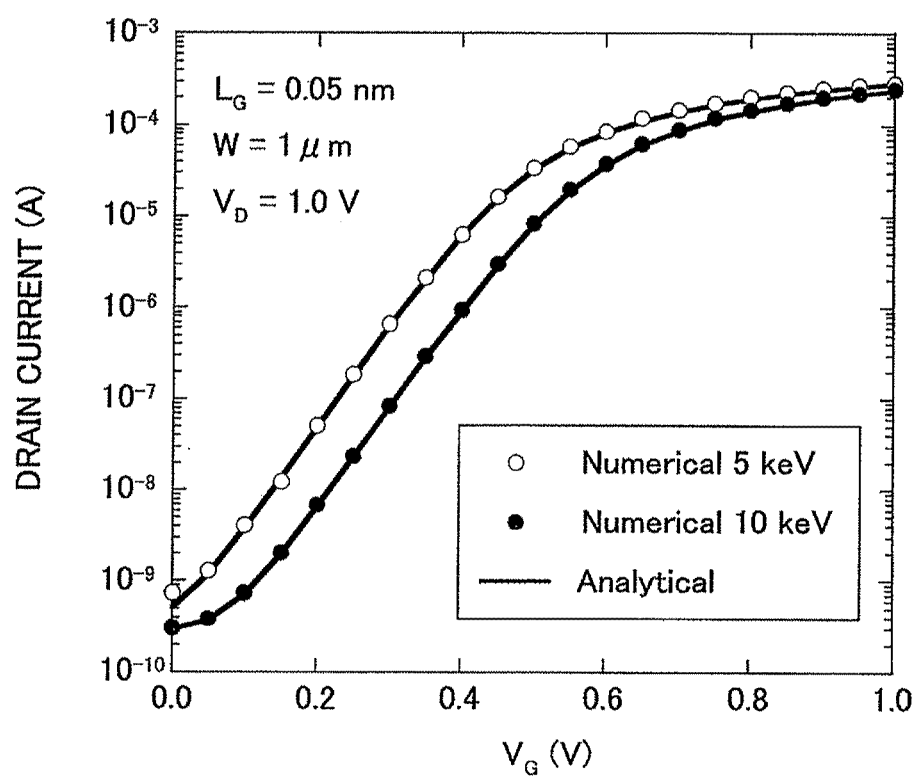
FIG. 19 is an example graph illustrating a result of a device simulation using the two-dimensional concentration distributions of the analytical model and the numerical calculation by the process simulator HyPros.

Both of the impurity concentration distributions are acquired in the device simulator (see, for example, Non-Patent Document 29), and the evaluation result of the $V_G$-$I_D$ characteristics are illustrated in FIG. 19. FIG. 19 is a graph illustrating results of the device simulation using the two-dimensional concentration distributions based on the analytical model and the numerical calculation by the process simulator HyPros. According to the results illustrated in FIG. 19, both results correspond well to each other when the gate length "$L_G$"=0.05 μm and 0.2 μm.

Figure 20:
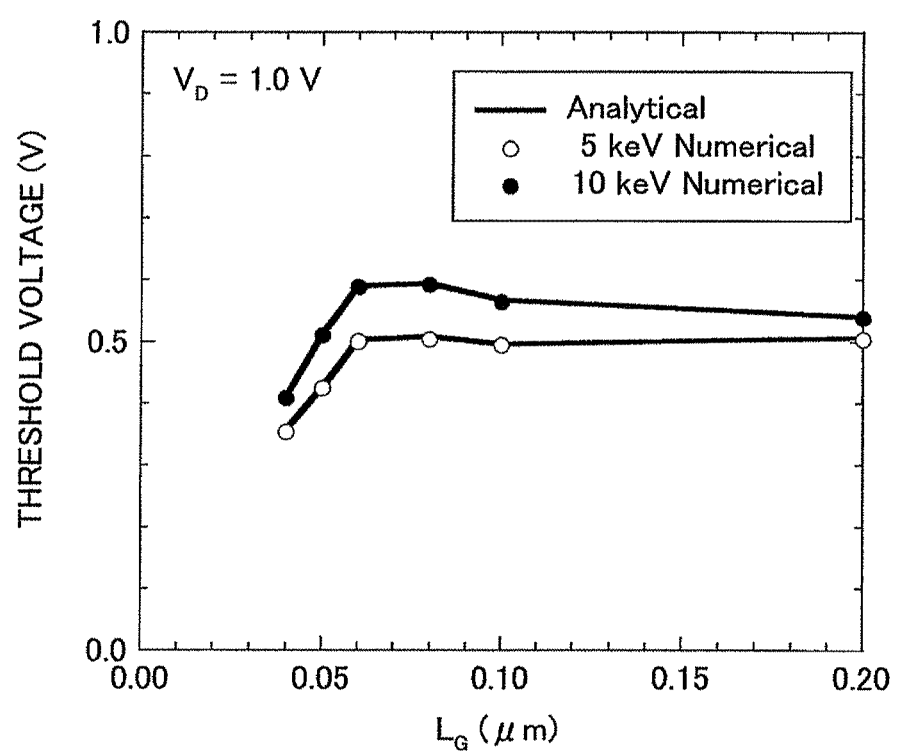
FIG. 20 is an example graph illustrating a gate-length dependency of a threshold value voltage.

The gate-length dependency of a threshold voltage "$V_{th}$" is described with reference to FIG. 20. FIG. 20 is a graph illustrating the gate-length dependency of the threshold voltage "$V_{th}$". The threshold voltage "$V_{th}$" is defined as the gate voltage when the drain current $I_D$ obtained by numerical calculation is normalized to satisfy the following formula (44) based on the device size (i.e., gate length "$L_G$", device length "W").

$$\frac{L_G}{W} I_D = 5 \times 10^{-7} A \tag{77}$$

As illustrated in FIG. 20, the result based on the analytical evaluation of the two-dimensional impurity concentration distribution corresponds well to the result based on the numerical calculation.

Figure 21:
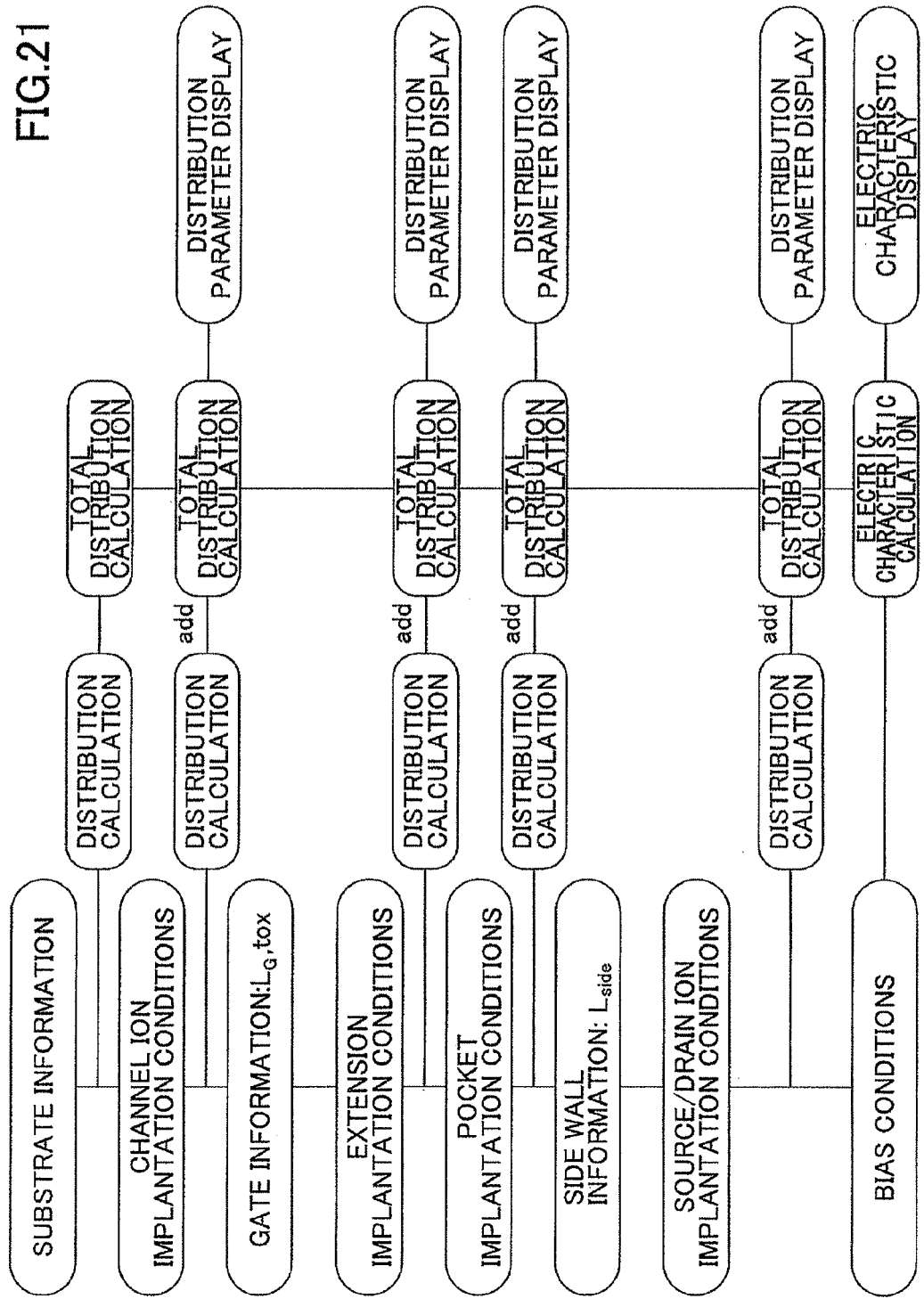
FIG. 21 is an example system configuration of electric-characteristic simulation of the MOSFET based on a pocket ion implantation distribution generating method according to an example 1 of the present invention.

FIG. 21 illustrates an example of a system configuration of electric-characteristic simulation of the MOSFET in consideration of the pocket ion implantation distribution generating method according to the example 1 of the present invention. As illustrated in FIG. 21, substrate information, channel ion implantation conditions, gate information (i.e., gate electrode length $L_G$, gate insulating film thickness $t_{OX}$), extension implantation conditions, side wall information ($L_{side}$), and source/drain implantation conditions are input to calculate the ion implantation distribution of each step.

Next, in each step, the calculation results of the step are summed to perform a total distribution calculation, so that the distribution and the parameters in each step are displayed. Examples of the ion implantation distribution in the pocket ion implantation are illustrated in FIGS. 22A, 22B, and 22C for the regions $a_1$, $a_2$, and b, respectively. FIG. 22A illustrates the ion implantation distribution of the region $a_1$ which is not influenced by the gate. FIG. 22B illustrates the ion implantation distribution in the region $a_2$ which is influenced by the gate based on the contribution from the side wall of the gate. FIG. 22C illustrates the ion implantation distribution in the region $a_2$ which is influenced by the gate based on the contribution from a plane part of the region $a_2$.

Figure 23:
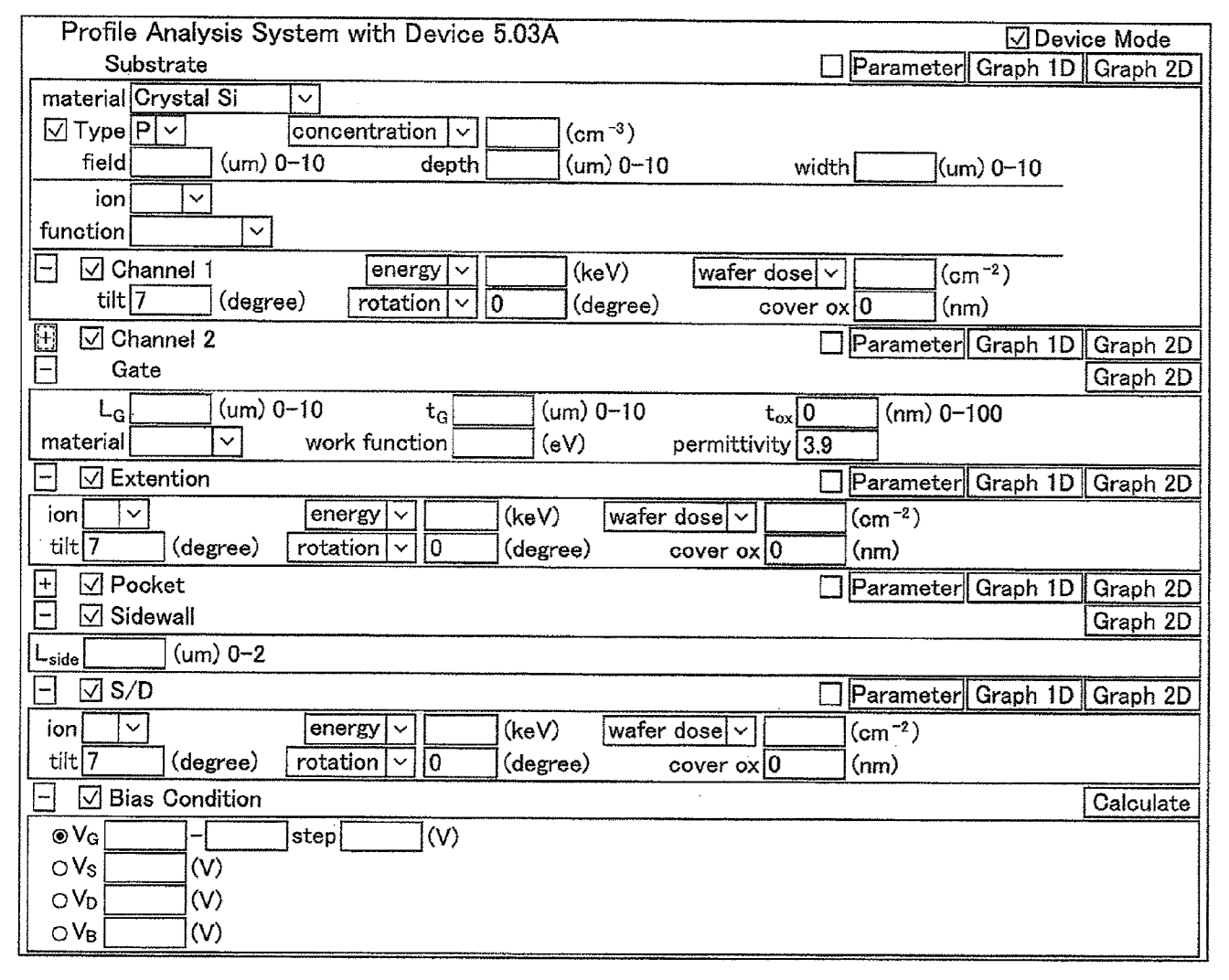

Finally, bias conditions are input, and based on the ion implantation distribution in each step described above, the electric characteristics such as $V_G$-$I_D$ characteristics and the results are displayed. FIG. 23 illustrates an example of an input screen an analytical model DAS (Device Analysis System) according to the example 1 of the present invention.

As described above, by using the device simulation using the analytical two-dimensional distribution model, it may become possible to obtain the electric characteristics similar to those obtained by the numerical calculation. Because of this feature, it may become possible to easily perform the device simulation by associating with the process conditions.

[b] Example 2

Next, a comparison between the analytical model and the numerical calculation having the tilt angle dependency in the ion implantation distribution using the Joined half Gauss distribution according to an example 2 of the present invention is described with reference to FIGS. 24A and 24B. FIG. 24A illustrates calculation results of the numerical calculation and the analytical model when B is ion-implanted into amorphous silicon at 40 keV. As illustrated in FIG. 24A, the calculation results in both graphs (data) substantially correspond to each other. On the other hand, FIG. 24B illustrates calculation results of the numerical calculation and the analytical model when As is ion-implanted into the amorphous silicon at 40 keV. As illustrated in FIG. 24B, the calculation results in both graphs substantially correspond to each other.

Figure 25A:
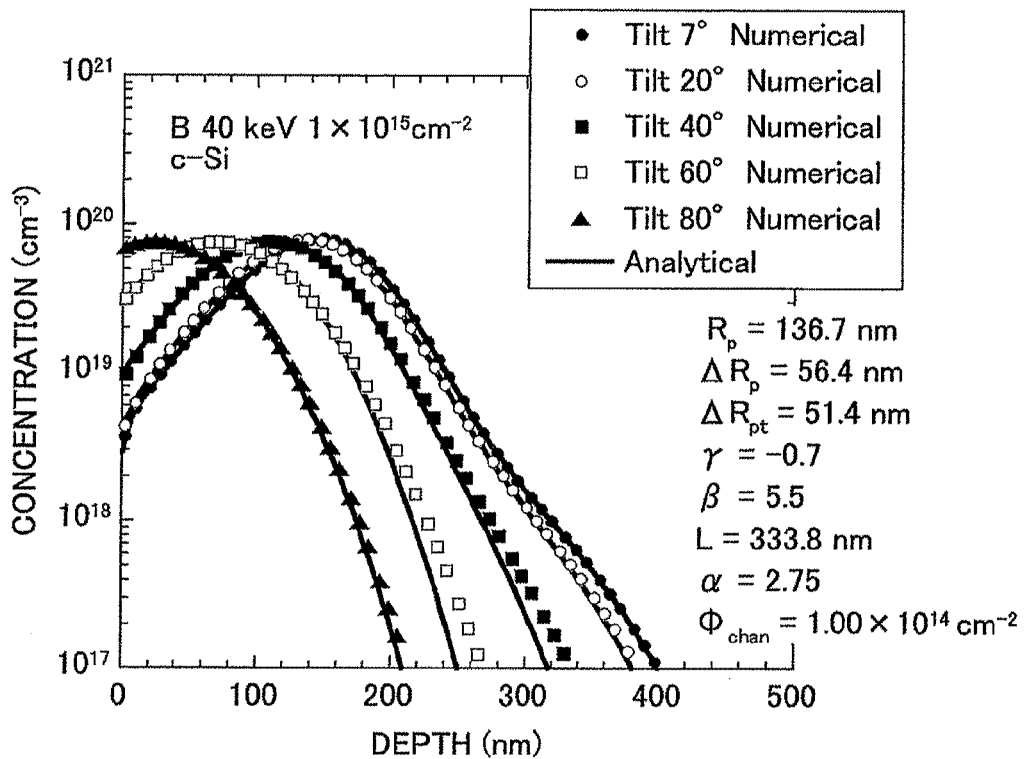
FIGS. 25A and 25B are graphs illustrating an example comparison between the analytical model and the numerical calculation in the tilt angle dependency of the ion implantation distribution expressed using a tail function.
Figure 25B:
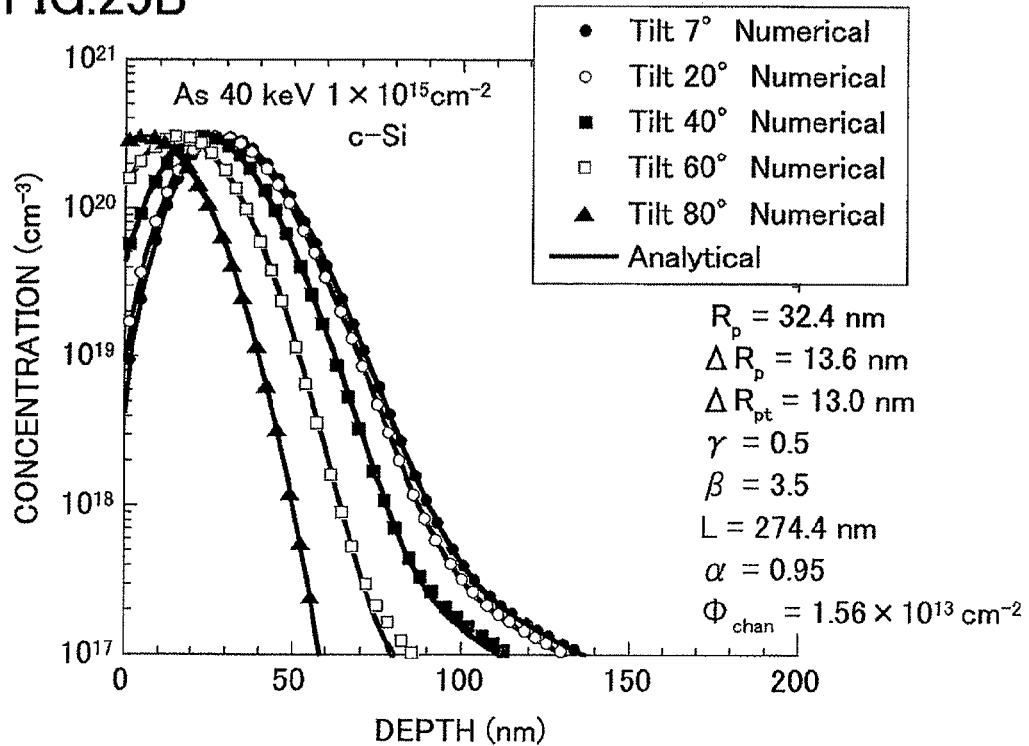

Next, a comparison between the analytical model and the numerical calculation having the tilt angle dependency in the ion implantation distribution expressed by the tail function using formula (63) in step S80 of FIG. 16 is described with reference to FIGS. 25A and 25B. FIG. 25A illustrates calculation results of the numerical calculation and the analytical model when B is ion-implanted into monocrystal silicon at 40 keV. As illustrated in FIG. 25A, the calculation results in both graphs substantially correspond to each other, but slightly differ from each other in the tail portions when the tilt angle is 40 deg. and 60 deg. On the other hand, FIG. 25B illustrates calculation results of the numerical calculation and the analytical model when As is ion-implanted into the monocrystal silicon at 40 keV. As illustrated in FIG. 25B, the calculation results in both graphs relatively and substantially correspond to each other.

As described above, even based on the analytical model using the Joined half Gauss distribution, it may become possible to generate (obtain) the ion implantation distribution similar to that in the case of the numerical calculation. Further, in the analytical model according to the example 2 of the present invention, it may be analytically treated based on the Gauss distribution. Because of this feature, it may become possible to greatly reduce the calculation time when compared with the case of the numerical calculation.

[c] Example 3

Figure 26A:
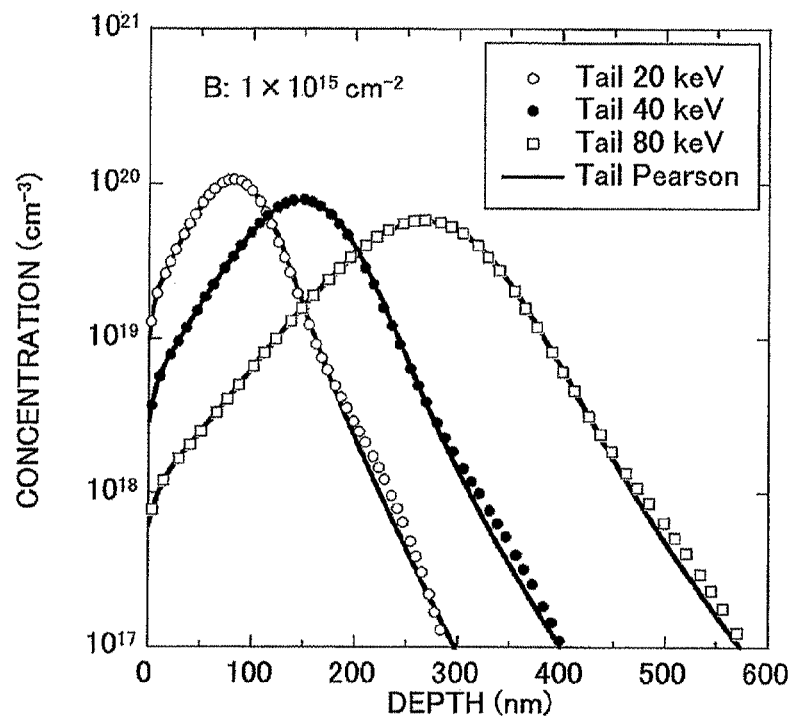
FIGS. 26A and 26B are graphs illustrating a comparison between the tail function and a tail Pearson.

Next, a tail Pearson distribution according to an example 3 of the present invention is described with reference to FIGS. 26A, 26B, and 27. Herein, a comparison is illustrated between the dual Pearson using the Person distribution generated based on the moments "$R_p$", "$\Delta R_p$", "$\gamma$", and "$\beta$" of the tail function and the tail function.

A comparison between the tail function in step 81 of FIG. 16 and the tail Pearson is described with reference to FIGS. 26A and 26B. FIG. 26A illustrates a comparison between the distribution in the tail function and the tail Pearson distribution when B is ion-implanted into monocrystal silicon at 20 keV, 40 keV, and 80 keV. FIG. 26A illustrates both graphs well correspond to each other.

Figure 26B:
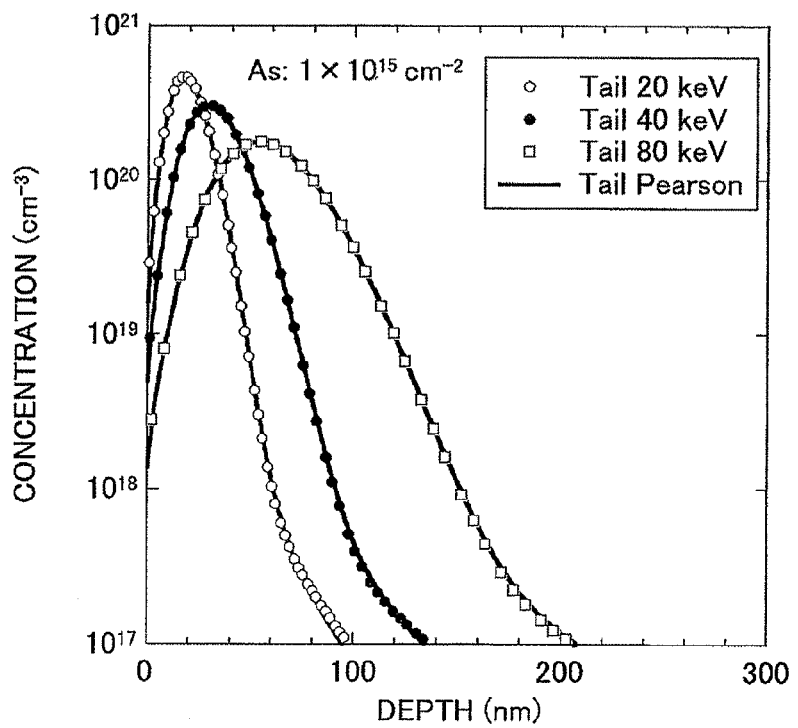

FIG. 26B illustrates a comparison between the distribution in the tail function and the tail Pearson distribution when As is ion-implanted into the monocrystal silicon at 20 keV, 40 keV, and 80 keV. FIG. 26B also illustrates both graphs well correspond to each other.

FIG. 27 illustrates comparison tables between parameters of the tail function and parameters of tail Pearson distribution. In this case, when the Pearson function included in the tail function is Pearson IV, a process is added. Pearson is defined in the entire regions. Therefore, it may become larger than the tail function in a low-concentration region. This feature may influence the moment "$\beta$", and as a result, the approximation of the tail function to the Pearson may be degraded.

To solve the problem, when the depth from a state where tail function is greater to a state where the Pearson IV is greater in the low-concentration region is $y_0$, the tail function is composed by using the transformation described in the following formula (78).

$$h_{mc}(y) + h_{Tc}(y) = \begin{cases} h_{mc}(y) + h_{Tc}(y) & \text{for } y \le y_0 \\ 0 + 2h_{Tc}(y) & \text{for } y > y_0 \end{cases} \tag{78}$$

According to the above description, by the disclosed simulator 100, it may become possible to achieve a pocket ion implantation distribution analytical model. Along with the analytical model of other process, all the impurity concentration distribution of MOS may be expressed using the analytical models. By using the simulator 100, it may become possible to generate an analytical model that well corresponds to the two-dimensional impurity concentration distribution obtained based on normal process simulation. Further, the device simulation using both distributions indicates similar electric characteristics. Because of this feature, it may become possible to easily realize device simulation by associating with the process conditions.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions has been described in detail, it is to be understood that various changes, substitutions, and alterations could be made hereto without departing from the sprit and scope of the invention.

What is claimed is:

1. A method for generating an ion implantation distribution by a computer, the method comprising:
    calculating ion implantation distribution regions in a case of generating the ion implantation distribution with a large tilt angle; and
    generating an analytical model of the ion implantation distribution in correspondence with each of the ion implantation distribution regions by using a Gauss distribution model;
    wherein the ion implantation distribution regions have different influence on a channel region depending on a gate structure formed on the ion distribution regions,
    wherein the generating of the ion implantation distribution with a large tilt angle includes performing a pocket ion implantation with a large tilt angle to form a pocket region, and
    wherein the tilt angle for performing the pocket ion implantation is greater than a tilt angle for performing a channel ion implantation for forming a channel region.

2. The method according to claim 1, further comprising:
    performing an approximation to a Joint half Gauss distribution by extending a Pearson distribution for a projection function by expressing a pocket ion implantation distribution as the projection function and a function indicating an extension of the distribution in each of axis directions, the pocket ion implantation distribution being formed in correspondence with each of the ion implantation distribution regions by using a Gauss distribution model.

3. The method according to claim 2, further comprising:
    evaluating a high-order moment $\gamma$ based on two moments which are straggling of a range of a front Gauss distribution and straggling of the range of a rear Gauss distribution of the Joint half Gauss distribution.

4. The method according to claim 3, further comprising:
    evaluating a tilt angle dependency of the two moments of the Joint half Gauss distribution.

5. The method according to claim 4, further comprising:
    evaluating a high-order moment $\gamma$ of the Joint half Gauss distribution at a tilt angle based on the evaluated tilt angle dependency of the two moments.

6. The method according to claim 5, further comprising:
    transforming the evaluated high-order moment $\gamma$ of the Joint half Gauss distribution at the tilt angle into a high-order moment $\gamma$ of the Pearson distribution.

7. The method according to claim 6, further comprising:
    evaluating a high-order moment $\beta$ based on the transformed high-order moment $\gamma$ of the Pearson distribution.

8. The method according to claim 7, further comprising:
    evaluating the tilt angle dependency of the high-order moment $\beta$ when the high-order moment $\gamma$ of the Pearson distribution is zero.

9. The method according to claim 7, further comprising:
    obtaining a projected distribution indicated by a depth and a concentration of an ion implantation by executing a process,
    wherein the process includes
    performing an approximation to a Joint half Gauss distribution by extending a Pearson distribution for a projection function by expressing a pocket ion implantation distribution as the projection function and a function indicating an extension of the distribution in each of axis directions, the pocket ion implantation distribution being formed in correspondence with each of the ion implantation distribution regions by using a Gauss distribution model,
    evaluating a high-order moment $\gamma$ based on two moments which are straggling of a range of a front Gauss distribution and straggling of the range of a rear Gauss distribution of the Joint half Gauss distribution,
    evaluating a tilt angle dependency of the two moments of the Joint half Gauss distribution,
    evaluating a high-order moment $\gamma$ of the Joint half Gauss distribution at a tilt angle based on the evaluated tilt angle dependency of the two moments,
    transforming the evaluated high-order moment $\gamma$ of the Joint half Gauss distribution at the tilt angle into a high-order moment $\gamma$ of the Pearson distribution, and
    evaluating a high-order moment $\beta$ based on the transformed high-order moment $\gamma$ of the Pearson distribution.

10. The method according to claim 9, further comprising:
    obtaining a two-dimensional concentration distribution by substituting the projected distribution indicated by the depth and the concentration of the ion implantation into the projected distribution of the pocket ion implantation distribution.

11. The method according to claim 7, further comprising:
    obtaining a projected distribution indicated by a depth and a concentration of an ion implantation by assuming angle dependency of parameters of a tail function by transforming from $Y_T = R_p + \Delta R_p$ to $(R_p + \Delta R_p)\cos\theta$, from L to L cos $\theta$, and from $\alpha$ to $\alpha$.

12. The method according to claim 7, further comprising:
    performing an approximation to the Pearson distribution to form a dual Pearson distribution by evaluating a moment of a tail function; and
    executing a process on two Pearson distributions of the dual Pearson distribution,
    wherein the process includes
    performing an approximation to a Joint half Gauss distribution by extending a Pearson distribution for a projection function by expressing a pocket ion implantation distribution as the projection function and a function indicating an extension of the distribution in each of axis directions, the pocket ion implantation distribution being formed in correspondence with each of the ion implantation distribution regions by using a Gauss distribution model, evaluating a high-order moment γ based on two moments which are straggling of a range of a front Gauss distribution and straggling of the range of a rear Gauss distribution of the Joint half Gauss distribution, evaluating a tilt angle dependency of the two moments of the Joint half Gauss distribution, evaluating a high-order moment γ of the Joint half Gauss distribution at a tilt angle based on the evaluated tilt angle dependency of the two moments, transforming the evaluated high-order moment γ of the Joint half Gauss distribution at the tilt angle into a high-order moment γ of the Pearson distribution, and evaluating a high-order moment β based on the transformed high-order moment γ of the Pearson distribution.

13. The method according to claim 1, further comprising:
generating a box distribution including a rectangular region having a constant concentration at each of a source region and a drain region by associating with a moment parameter of the ion implantation distribution.

14. The method according to claim 13,
wherein the rectangular region is any one of a first region, a second region, and a third region,
wherein the first region is obtained based on a projection of a range upon an ion implantation, straggling of the projection in depth, and straggling of the projection in a lateral direction,
the second region is obtained by a depth having a range including an upper part and a lower part of a boundary and straggling of the projection in the lateral direction, the boundary being determined based on the projection of the range, and
the third region is different from the first region in that a junction curve is formed at a junction part between the straggling of the projection in depth and the straggling of the projection in the lateral direction.

15. The method according to claim 13, further comprising:
generating the box distribution upon the ion implantation distribution with a large tilt angle.

16. The method according to claim 1, wherein the tilt angle for performing the pocket ion implantation is greater than 7 degrees.

17. A device simulator for simulating a device by generating an ion implantation distribution, the device simulator comprising:

a computer that calculates ion implantation distribution regions in a case of generating the ion implantation distribution with a large tilt angle and generates an analytical model of the ion implantation distribution in correspondence with each of the ion implantation distribution regions by using a Gauss distribution model;

wherein the ion implantation distribution regions have different influence on a channel region depending on a gate structure formed on the ion distribution regions, wherein the generating of the ion implantation distribution with a large tilt angle includes performing a pocket ion implantation with a large tilt angle to form a pocket region, and wherein the tilt angle for performing the pocket ion implantation is greater than a tilt angle for performing a channel ion implantation for forming a channel region.

18. The device simulator according to claim 17, wherein the tilt angle for performing the pocket ion implantation is greater than 7 degrees.

19. An inverse modeling simulator for simulating a device by generating an ion implantation distribution, the inverse modeling simulator comprising:

a computer that calculates ion implantation distribution regions in a case of generating the ion implantation distribution with a large tilt angle and generates an analytical model of the ion implantation distribution in correspondence with each of the ion implantation distribution regions by using a Gauss distribution model;

wherein the ion implantation distribution regions have different influence on a channel region depending on a gate structure formed on the ion distribution regions, wherein the generating of the ion implantation distribution with a large tilt angle includes performing a pocket ion implantation with a large tilt angle to form a pocket region, and wherein the tilt angle for performing the pocket ion implantation is greater than a tilt angle for performing a channel ion implantation for forming a channel region.

20. The inverse modeling simulator according to claim 19, wherein the tilt angle for performing the pocket ion implantation is greater than 7 degrees.

* * * * *